US006486955B1

(12) United States Patent
Nishi

(10) Patent No.: US 6,486,955 B1
(45) Date of Patent: Nov. 26, 2002

(54) SHAPE MEASURING METHOD AND SHAPE MEASURING DEVICE, POSITION CONTROL METHOD, STAGE DEVICE, EXPOSURE APPARATUS AND METHOD FOR PRODUCING EXPOSURE APPARATUS, AND DEVICE AND METHOD FOR MANUFACTURING DEVICE

(75) Inventor: Kenji Nishi, Kanagawa-ken (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/806,516

(22) PCT Filed: Oct. 13, 1999

(86) PCT No.: PCT/JP99/05640

§ 371 (c)(1),
(2), (4) Date: Apr. 16, 2001

(87) PCT Pub. No.: WO00/22376

PCT Pub. Date: Apr. 20, 2000

(30) Foreign Application Priority Data

Oct. 14, 1998 (JP) .............................. 10-291779

(51) Int. Cl.$^7$ ....................... G01B 11/24; H01L 21/027; G03B 9/00
(52) U.S. Cl. ................. 356/401; 356/500; 356/511
(58) Field of Search ............................. 356/401, 400, 356/492, 500, 509, 511, 598, 620, 596

(56) References Cited

U.S. PATENT DOCUMENTS

| | | | |
|---|---|---|---|
| 5,151,749 A | 9/1992 | Tanimoto et al. | 356/401 |
| 5,363,196 A | 11/1994 | Cameron | 356/500 |
| 5,757,160 A | 5/1998 | Kreuzer | 356/509 |
| 5,801,832 A | 9/1998 | Van Den Brink | 356/500 |
| 5,920,390 A * | 7/1999 | Iwanaga | 356/401 |
| 6,084,673 A | 7/2000 | Van Den Brink et al. | 356/496 |
| 6,130,751 A * | 10/2000 | Haginiwa | 356/401 |
| 6,411,387 B1 * | 6/2002 | Kankeo et al. | 356/401 |

FOREIGN PATENT DOCUMENTS

| | | |
|---|---|---|
| JP | 9-79829 | 3/1997 |
| JP | 10-260037 | 9/1998 |

* cited by examiner

Primary Examiner—Drew A. Dunn
(74) Attorney, Agent, or Firm—Oblon, Spivak, McClelland, Maier & Neustadt, P.C.

(57) ABSTRACT

The shape of a reflecting surface (7XS) formed on a moving object (4) moving along a reference plane is measured by measuring one-dimensional shapes of the reflecting surface (7XS) along the extending direction of the reflecting surface (7XS) at a plurality of different positions in a direction perpendicular to the reference plane. At least one of the position and posture of the moving object (4) is accurately controlled on the basis of the shape information obtained in this manner, the two-dimensional position information of the moving object (4), and the tilt information of the reflecting surface (7XS).

41 Claims, 20 Drawing Sheets

SHAPE MEASURING METHOD AND SHAPE MEASURING DEVICE, POSITION CONTROL METHOD, STAGE DEVICE, EXPOSURE APPARATUS AND METHOD FOR PRODUCING EXPOSURE APPARATUS, AND DEVICE AND METHOD FOR MANUFACTURING DEVICE

TECHNICAL FIELD

The present invention relates to a reflecting surface shape measuring method, a reflecting surface shape measuring unit, a position control method, a stage unit, an exposure apparatus, a method of making the exposure apparatus, a device, and a method of manufacturing the device and, more particularly, to a shape measuring method and shape measuring unit for the reflecting surface of a reflecting mirror provided for a moving object such as a stage, a position control method using the shape information of the reflecting surface measured by the shape measuring method, a stage unit for controlling the position of a sample mounted thereon by the position control method, an exposure apparatus which controls the position of a mask or substrate by the position control method, a method of making the exposure apparatus, a microdevice manufactured by using the exposure apparatus, and a method of manufacturing the microdevice.

BACKGROUND ART

In a lithography process for manufacturing a semiconductor element, liquid crystal display element, or the like, an exposure apparatus has been used. In such an exposure apparatus, patterns formed on a mask or reticle (to be generically referred to as a "reticle" hereinafter) are transferred through a projection optical system onto a substrate such as a wafer or glass plate (to be referred to as a "substrate or wafer" hereinafter, as needed) coated with a resist or the like. As apparatuses of this type, a static exposure type projection exposure apparatus, e.g., a so-called stepper, and a scanning exposure type projection exposure apparatus, e.g., a so-called scanning stepper are mainly used. In these types of projection exposure apparatuses, a wafer stage capable of moving two-dimensionally while holding a wafer is provided to sequentially transfer patterns formed on a reticle onto a plurality of shot areas on the wafer. In a scanning exposure type projection exposure apparatus, a reticle stage for holding a reticle can also move in the scanning direction.

In such a projection exposure apparatus, since a circuit pattern having a very minute structure is transferred onto a wafer, position control on the wafer and reticle must be accurately performed. For this accurate position control, a reflecting mirror arranged on the wafer stage or reticle stage is irradiated with a measurement beam, and the two-dimensional position of the wafer stage or reticle stage is accurately detected on the basis of the fringe pattern of interference light between the reflected light and reference light or the phase difference therebetween.

In the above two-dimensional position detection, the height position of a detection point is preferably matched with the height position of a wafer surface coated with a resist or the like, or the pattern formation surface of the reticle. However, for example, in the case of a wafer stage, as the distance (so-called working distance) between the projection optical system and the wafer stage decreases with an increase in the N.A. of the projection optical system, it is becoming difficult to arrange a reflecting mirror on the upper surface of the wafer stage. For this reason, there is proposed a technique of arranging a reflecting mirror on a side surface of a wafer stage and correcting a so-called Abbe error caused when the height position of the detection point does not coincide with the height position of a wafer surface coated with a resist or the like.

A conventional technique of correcting such an Abbe error will be described below with reference to FIGS. 23A to 23C by exemplifying the case where an Abbe error in the X direction of the wafer stage moving along the X-Y plane is corrected.

In the conventional technique, as shown in FIG. 23A, a tilt interferometer (heterodyne differential interferometer) 103 is used to detect the tilt state of a substrate table 101, i.e., the rotation amount of a reflecting surface 102S of a reflecting mirror (plane-parallel plate mirror) 102 around the Y-axis, which is arranged on one side surface of the substrate table 101 and extends along the Y-axis direction.

In the tilt interferometer 103, two light beams which are emitted from a light source unit (not shown), slightly differ in their wavelengths, and are polarized in orthogonal directions are incident on a polarizing beam splitter 105 to be split into two light beams in accordance with each polarizing direction. A light beam LU that is deflected by the polarizing beam splitter 105 and propagates in the +Z direction is reflected by a reflecting prism 106. This light beam is then incident on the reflecting surface 102S (the Z position of the incident point=$Z_A$) and reflected. Note that the tilt interferometer 103 shown in FIGS. 23A to 23C uses the double-pass scheme. The light beam LU reflected by the reflecting prism 106 is reflected twice by the reflecting surface 102S via a polarizing beam splitter 107U for double-pass branching and a quarter-wave plate 108U. The light beam LU reflected in this manner propagates toward a light-receiving unit (not shown) via the quarter-wave plate 108U, polarizing beam splitter 107U, reflecting prism 106, and polarizing beam splitter 105.

In the mean time, a light beam LL that is transmitted through the polarizing beam splitter 105 and propagates in the +X direction passes through a half-wave plate 109, and then strikes a polarizing beam splitter 107L for double-pass branching. Subsequently, like the light beam LU, the light beam LL strikes two points (each having Z position=$Z_B$(= $Z_A$−D)) on the reflecting surface of the reflecting mirror 102 via the polarizing beam splitter 107L, a λ/4 plate 108L, and the like. Thereafter, the light beam sequentially passes through the λ/4 plate 108L, polarizing beam splitter 107L, half-wave plate 109, and polarizing beam splitter 105 and propagates toward the light-receiving unit (not shown) along almost the same optical path as that of the light beam LU.

The light input to the light-receiving unit is therefore the composite light of the light beams LU and LL. In the light-receiving unit, the light beams LU and LL are made to interfere with each other, with their polarizing directions being matched with each other, to generate interference light reflecting the optical path length difference between the light beams LU and LL, thereby measuring the interference light. Therefore, the tilt interferometer 103 can be used to monitor the rotation state of the reflecting surface of the reflecting mirror 102 around the Y-axis with reference to the reset state of the tilt interferometer 103, i.e., the rotation state of the substrate table 101 around the Y-axis.

Consider a case where the rotational angle of the reflecting surface 102S of the reflecting mirror 102 around the Y-axis direction is 0° while the tilt interferometer 103 is in the reset state, and a wafer W has a taper angle θ in the X direction, as shown in FIG. 23B. In this case, in an exposure apparatus having an autofocus system for detecting the Z position of the surface of the wafer W and its rotations around the X- and Y-axes and matching an exposure area on the surface of the wafer W with the image plane of a projection optical system, the substrate table 101 is rotated through the taper angle θ around the Y-axis in accordance with the observation result obtained by the autofocus system. With this operation, the surface of the wafer W is matched with the image plane of the projection optical system. As shown in FIG. 23C, however, there is an offset between the actual X position of each point on the surface of the wafer W and the X position of the corresponding point on the surface of the wafer W which is obtained from the corresponding X position on the substrate table 101 which is obtained by an X position detection interferometer using the reflecting mirror 102. This positional offset (Abbe error) $\Delta X_A$ is given by $$\Delta X_A = L \cdot \theta \tag{1}$$

where L is the difference between the Z position on the surface of the wafer W and the Z position obtained by performing X position measurement on the substrate table 101 with, for example, Z position=$Z_A$.

When the substrate table 101 is rotated through the taper angle θ around the Y-axis, an output value from the tilt interferometer 103 indicates that the optical path length is D·θ, and the optical path length difference D·θ is obtained from the output value from the tilt interferometer 103. If, therefore, distances D and L are known, the Abbe error $\Delta X_A$ can be given by $$\Delta X_A = ((D \cdot \theta)/D) \cdot L \tag{2}$$

By correcting the Abbe error obtained in this manner, a pattern formed on the reticle can be accurately transferred onto the wafer.

As described above, in the prior art, Abbe errors are corrected on the premise that the reflecting surface of a reflecting mirror is perfectly flat. It is, however, impossible to make the reflecting surface of a reflecting mirror perfectly flat; undulations or curls are inevitably present on the reflecting surface of the reflecting mirror.

For this reason, for example, as shown in FIG. 24A, even if the rotational angle of the substrate table 101 around the Y-axis is 0° at the reset position of the tilt interferometer 103, and the wafer W has no tapered portion, the reflecting surface 102S of the reflecting mirror 102 is rotated around the Y-axis, as shown in FIG. 24B, due to the undulations or curls of the reflecting surface 102S of the reflecting mirror 102. In this case, letting θ' be the tilt angle with respect to the Z-axis, the output value from the tilt interferometer 103 indicates that the optical path length difference is D·θ'. That is, the measurement result obtained by the tilt interferometer 103 will mislead an operator into believing that the substrate table 101 is rotated through the angle θ' around the Y-axis.

As a result, if the position of the wafer W is corrected within the X-Y plane by an Abbe error $\Delta X_A' (= \{(D \cdot \theta')/D\} \cdot L)$, the position of the wafer W is offset accordingly, as shown in FIG. 24C. Therefore, a pattern formed on the reticle can not be accurately transferred onto the wafer.

It is expected that a deterioration in position control precision due to erroneous recognition of Abbe errors caused by undulations or curls of a reflecting mirror will accelerate owing to an increase in the length of the reflecting mirror due to an increase in the size of the stage accompanying an increase in the size of a wafer. This may become a factor that interferes with an increase in exposure precision that is required with a reduction in transfer pattern size. This applies to a reticle stage (a reticle stage in a scanning exposure apparatus using the step-and-scan scheme, in particular). Therefore, demands have arisen for new techniques associated with high-precision position control on a stage.

The present invention has been made in consideration of the above situation, and its first object is to provide a shape measuring method and a shape measuring unit which accurately measure the shape of a reflecting surface formed on an moving object such as a stage to perform high-precision position control on a sample mounted on the moving object such as a stage.

It is the second object of the present invention to provide a position control method which can perform high-precision position control on a moving object, including correction of Abbe errors.

It is the third object of the present invention to provide a stage unit which can accurately control the position of a sample mounted thereon.

It is the fourth object of the present invention to provide an exposure apparatus which can perform pattern transfer and improves exposure precision by accurately controlling the position of a mask or substrate.

It is the fifth object of the present invention to provide a device on which a fine pattern is accurately formed and a method of manufacturing the device.

DISCLOSURE OF INVENTION

According to the first aspect of the present invention, there is provided a shape measuring method of measuring a shape of a reflecting surface which is formed on a moving object moving along a reference plane perpendicular to a first axis and extends along a second axis direction perpendicular to the first axis direction, characterized in that a one-dimensional shape of the reflecting surface in the second axis direction is measured at least at two positions in the first axis direction while the moving object is moved along a third axis direction which is perpendicular to the first axis direction and is not perpendicular to the second axis direction.

According to this method, the shape of the reflecting surface is measured by measuring the one-dimensional shapes of the reflecting surface in the direction along the second axis, in which the reflecting surface extends, at least at two positions in the first axis direction. Even if, therefore, the reflecting surface formed on the moving object undulates or curls, the shape of the reflecting surface which is required to correct the position or posture of the moving object, including the Abbe errors, can be measured.

According to the shape measuring method of the present invention, in the one-dimensional shape measurement, for example, a plurality of measurement light beams are incident on different positions on the reflecting surface along a plane parallel to the reference plane while the moving object is moved along the second axis direction, and the local rotational angle of the reflecting surface around the first axis can be sequentially measured on the basis of the light beams reflected by the reflecting surface. However, the reflecting surface as a measurement target rotates/vibrates around the first axis due to the rotation/vibration (yawing) of the moving object upon movement of the moving object along the second axis direction. Such rotation/vibration affects measurement on the local rotational angle of the reflecting surface around the first axis, resulting in an error in one-dimensional shape measurement.

In the measuring method of the present invention, therefore, preferably, in measuring the one-dimensional shape, a plurality of light beams composing a first set of measurement light beams are incident, along a plane parallel to the reference plane, onto different positions on the reflecting surface in the second axis direction while the moving object is moved in the third axis direction, and on the basis of that reflection light, a local rotation amount of the reflecting surface around the first axis is measured in accordance with a moving position of the moving object; and at almost the same time, a second set of measurement light beams composed by a plurality of light beams in the third axis direction which are apart from each other in a direction different from the first axis direction along a plane parallel to the reference plate and propagate in the third axis direction are incident onto a reflecting unit attached to the moving object, and on the basis of that reflection light a rotation amount of the moving object around the first axis is measured.

According to this method, since the second set of measurement light beams are incident on the reflecting unit from the same axis direction as the moving direction of the moving object and kept incident on almost the same positions of the reflecting unit, the yawing amount of the moving object from the state at the start of measurement can be accurately measured. Therefore, by correcting (removing) the yawing amount of the moving object almost simultaneously measured from the local rotation amount of the reflecting surface around the first axis by using the first set of measurement light beams, the local rotation amount of the reflecting surface around the first axis due to the shape of the reflecting surface can be accurately obtained. This makes it possible to accurately measure the one-dimensional shape of the reflecting surface. In this case, the second set of measurement light beams can include two light beams apart from each other along a direction perpendicular to the first axis direction and third axis direction.

In the above case, the first set of measurement light beams can include two light beams perpendicular to the reflecting surface (to be referred to as "two-beam shape measurement" hereinafter). In addition, the first set of measurement light beams may include three light beams which are arranged at different intervals and perpendicular to the reflecting surface, and a rotation amount of the moving object around the first axis and a local rotation amount of the reflecting surface around the first axis may be measured every time the moving object is moved in the third axis direction by a distance corresponding to a difference between the intervals (to be referred to as "three-beam shape measurement" hereinafter). The one-dimensional shape measurement can be performed more accurately by three-beam shape measurement than two-beam shape measurement.

In the shape measuring method according to the present invention, every time a one-dimensional shape of the reflecting surface is measured at least at two positions in the first axis direction, a two-dimensional position of a predetermined mark on the moving object within a plane parallel to the reference plane, and the measured one-dimensional shape data can be corrected on the basis of the measurement result. According to this method, for example, a heterodyne interferometer and the like are used, and reset operation is performed every time one-dimensional shape measurement is performed after the position in the first axis is changed. This makes it possible to correct offsets between the respective one-dimensional shape measurement results. Therefore, the shape of the reflecting surface can be measured with high accuracy.

According to the second aspect of the present invention, there is provided a shape measuring unit for measuring a shape of a reflecting surface which is formed on a moving object moving along a reference plane perpendicular to a first axis and extends along a second axis direction perpendicular to the first axis direction, characterized by comprising a first driving unit for moving the moving object along a third axis direction which is perpendicular to the first axis direction and is not perpendicular to the second axis direction, and a measuring unit for measuring a one-dimensional shape of the reflecting surface in the second axis direction at least at two positions in the first axis direction.

According to this unit, the measuring unit measures the shape of the reflecting surface by measuring the one-dimensional shapes in a direction along the second axis, in which the reflecting surface extends, at least at two positions in the first axis direction. Even if, therefore, the reflecting surface formed on the moving object undulates or curls, the shape information of the reflecting surface which is required to correct the position or posture of the moving object, including the Abbe errors, can be obtained.

The shape measuring unit of the present invention can be configured so that the measuring unit comprises a first measuring unit for making a plurality of light beams composing a first set of measurement light beams, along a plane parallel to the reference plane, to be incident onto different positions on the reflecting surface in the second axis direction, and measuring a local rotation amount of the reflecting surface around the first axis in accordance with a moving position of the moving object on the basis of that light reflected by the reflecting surface. In this case, since the first measuring unit measures the local rotation amount of the reflecting surface round the first axis while the first driving unit moves the moving object along the third axis direction, the one-dimensional shape of the reflecting surface can be measured.

In this case, the first measuring unit can be configured as a first laser interferometer system in which an axis perpendicular to the first and second axes serves as a measurement axis. In this case, since the local rotation amount of the reflecting surface around the first axis is measured by the laser interferometer system capable of obtaining a very accurate measurement result, the one-dimensional shape of the reflecting surface can be accurately measured.

Note that the first set of measurement light beams includes two light beams substantially perpendicular to the reflecting surface. This makes it possible to perform the above two-beam measurement. In addition, the first set of measurement light beams includes three light beams which are arranged at different intervals and perpendicular to the reflecting surface. This makes is possible to perform the above three-beam measurement.

The measuring unit can further comprise a second driving unit for relatively moving the moving object and second measuring unit in the first axis direction so as to perform one-dimensional shape measurement of the reflecting surface at different positions in the first axis direction, or an optical path changing unit for changing irradiation points of the second set of measurement light beams on the reflecting surface in the first axis direction. The use of the optical path changing unit, in particular, is effective when it is difficult to move the second measuring unit or moving object in the first axis direction in consideration of measurement precision, readjustment, the weight of the object to be moved, and the like.

The measuring unit can further comprise a second measuring unit for making a plurality of light beams forming a second set of measurement light beams, along a plane parallel to the reference plane, to be incident onto positions on the reflecting surface which differ from each other in the second axis direction and differ from the irradiation points of the first set of measurement light beams in the first axis direction, and measuring a local rotation amount of the reflecting surface around the first axis in accordance with a moving position of the moving object on the basis of that light reflected by the reflecting surface. In this case, since the second measuring unit performs one-dimensional shape measurement of the reflecting surface at a position different from a position in the first axis direction at which the first measuring unit performs one-dimensional shape measurement, the shape of the reflecting surface can be quickly measured by simultaneously operating the first and second measuring units.

In this case, the second measuring unit can be configured as a second laser interferometer system in which an axis perpendicular to the first and second axes serves as a measurement axis. In this case, since the local rotation amount of the reflecting surface around the first axis is measured by the laser interferometer system capable of obtaining a very accurate measurement result, the one-dimensional shape of the reflecting surface can be accurately measured.

The shape measuring unit of the present invention which includes the first measuring unit can be configured so that the measuring unit further comprises a third measuring unit for making a third set of measurement light beams, composed by a plurality of light beams which are apart from each other in a direction different from the first axis direction and propagate in the third axis direction, to be incident onto a reflecting unit mounted on the moving object from the third axis direction along a plane parallel to the reference plate, and measuring a rotation amount of the moving object around the first axis on the basis of that light reflected by the reflecting unit.

According to this unit, the third measuring unit can measure the rotation amount (yawing amount) of the moving object around the first axis at almost the same time when the first measuring unit measures the local rotation amount of the reflecting surface around the first axis. Therefore, the local rotation amount of the reflecting surface around the first axis due to the shape of the reflecting surface can be obtained very accurately by correcting the yawing amount of the moving object measured almost simultaneously by the third measuring unit in accordance with the local rotation amount of the reflecting surface around the first axis measured by the first measuring unit. This makes it possible to measure the one-dimensional shape of the reflecting surface very accurately.

In this case, the second measuring unit can be configured as a first laser interferometer system in which the third axis serves as a measurement axis. In this case, since a yawing amount is measured by the laser interferometer system capable of obtaining a very accurate measurement result, the one-dimensional shape of the reflecting surface can be accurately measured.

Note that the third set of measurement light beams can include two light beams apart from each other in a direction perpendicular to the first axis direction and third axis direction. In this case, since a necessary minimum number of measurement light beams are used, the arrangement of the second measuring unit can be simplified.

In addition, as the reflecting unit, a reflecting mirror or a plurality of cube corner prisms can be selected.

According to the third aspect of the present invention, there is provided a position control method, for a moving object which moves along a reference plane and has a reflecting surface, characterized in that at least one of a position and posture of the moving object is controlled on the basis of shape information of the reflecting surface measured by the shape measuring method of the present invention, two-dimensional position information of the moving object measured by using the reflecting surface, and tilt information of the reflecting surface. In this case, the "tilt information" is measurement information about the rotation of the reflecting surface around the axis (second axis) along which the reflecting surface extends, i.e., information before correction using the shape information of the reflecting surface. For example, "tilt information" is obtained from the difference between the position measurement results, with respect to the ideal orthogonal direction to the reflecting surface, at a plurality of different positions in the normal direction (first axis direction) of the reference plane on the reflecting surface. Note that "tilt information" in the specification will have the above meaning.

According to this method, since at least one of the position and posture of the moving object is controlled on the basis of the shape information of the reflecting surface measured by the shape measuring method of the present invention, the two-dimensional position information of the moving object, and the tilt information of the reflecting surface, accurate control can be performed.

According to the fourth aspect of the present invention, there is provided a stage unit for moving a sample along a reference plane perpendicular to a first axis, characterized by comprising a sample table on which the sample is mounted and which has a reflecting unit including at least one reflecting surface extending along a second axis direction perpendicular to the first axis direction; a driving unit for driving the sample table along the reference plane; and a two-dimensional position detection system for irradiating the reflecting unit with two-dimensional position detection light beams and detecting a two-dimensional position of the sample table on the basis of light beams reflected by the reflecting unit; a tilt detection system for irradiating the reflecting surface with at least two tilt detection light beams that are not in the same plane and are parallel to the reference plane and detecting a tilt amount of the reflecting surface with respect to the reference plane on the basis of light beams reflected by the reflecting surface; the shape measuring unit defined in claims 7 to 19, which measures a shape of the reflecting surface; a storage unit for storing shape information of the reflecting surface measured by the shape measuring unit; and a control system for controlling at least one of a position and posture of the sample table by controlling the first driving unit on the basis of two-dimensional position information detected by the two-dimensional position detection system, tilt information detected by the tilt detection system, and the shape information.

According to this unit, since at least one of the position and posture of the sample table is controlled on the basis of the shape information of the reflecting surface which is measured by the shape measuring unit of the present invention and stored in the storage unit, the two-dimensional position information detected by the two-dimensional position detection system, and the tilt information detected by the tilt detection system, at least one of the position and posture of the sample mounted on the sample table can be accurately controlled.

In the stage unit of the present invention, the driving unit can be configured to be used as a first driving unit in the shape measuring unit. In this case, since there is no need to prepare a separate driving unit for the shape measuring unit, the overall arrangement of the stage unit can be simplified.

In the stage unit of the present invention, the two-dimensional position detection light beams are two light beams that are vertically incident on the reflecting surface along a plane parallel to the reference plane, and the two light beams are used to measure a local rotation amount of the reflecting surface around the first axis in the shape measuring unit. This makes it possible to perform the above two-beam measurement. In addition, the two-dimensional position detection light beams are two light beams which are vertically incident on the reflecting surface along a plane parallel to the reference plane, the two light beams and one of the tilt detection light beams are three light beams which are arranged at different intervals and vertically incident on the reflecting surface along a plane parallel to the reference plane, and the three light beams are used to measure a local rotation amount of the reflecting surface around the first axis. This makes it possible to perform the above three-beam measurement.

According to the fifth aspect of the present invention, there is provided an exposure apparatus for transferring a pattern formed on a mask mounted on a mask stage onto a substrate mounted on a substrate stage, characterized by comprising the shape measuring unit of the present invention, which defines at least one of the mask stage and the substrate stage as a moving object; a two-dimensional position detection system for irradiating a reflecting unit, which is mounted on the moving object and includes the reflecting surface, with two-dimensional position detection light beams, and detecting a two-dimensional position of the moving object on the basis of light beams reflected by the reflecting unit; a tilt detection system for irradiating the reflecting surface with at least two tilt detection light beams that are not in a plane and are parallel to the reference plane, and detecting a tilt amount of the reflecting surface with respect to the reference plane on the basis of light beams reflected by the reflecting surface; and a control system for controlling at least one of a position and posture of the moving object on the basis of shape information of the reflecting surface measured in advance by the shape measuring unit, two-dimensional position information detected by the two-dimensional position detection system, and tilt information detected by the tilt detection system.

According to this apparatus, since at least one of the position and posture of the mask stage or substrate stage is controlled on the basis of the shape information of the reflecting surface formed on at least one of the mask stage and substrate stage, which is measured in advance by the shape measuring unit of the present invention, the two-dimensional position information detected by the two-dimensional position detection system, and the tilt information detected by the tilt detection system, the position or posture of the mask or sensitive sample can be accurately controlled, and a pattern formed on the mask is transferred onto a substrate mounted on the substrate stage. This makes it possible to improve the exposure precision.

According to the sixth aspect of the present invention, there is provided an exposure apparatus for transferring a pattern formed on a mask onto a substrate, characterized by comprising, a substrate table which holds the substrate and has at least two reflecting surfaces extending in intersecting directions; a driving system for driving the substrate table; a two-dimensional position detection system for irradiating at least two reflecting surfaces with measurement light beams and detecting a two-dimensional position of the substrate table on the basis of light beams reflected by the reflecting surfaces; a tilt detecting system for irradiating at least one of at least two reflecting surfaces with at least two tilt detection light beams that are not in the same plane and are parallel to the reference plane, and detecting a tilt amount of the reflecting surface with respect to the reference plane on the basis of light beams reflected by the reflecting surface; the shape measuring unit of the present invention, which measures a shape of a reflecting surface facing the tilt detection system; a storage unit for storing shape information of the reflecting surface facing the tilt detection system, which is measured by the shape measuring unit; and a control system for controlling the shape measuring unit and also controlling at least one of a position and posture of the substrate table on the basis of two-dimensional position information detected by the two-dimensional position detection system, tilt information detected by the tilt detection system, and the shape information.

According to this apparatus, since at least one of the position and posture of the substrate table is controlled on the basis of the shape information measured in advance by the shape measuring unit of the present invention, the two-dimensional position information detected by the two-dimensional position detection system, and the tilt information detected by the tilt detection system, at least one of the position and posture of the sensitive sample can be accurately controlled, and a pattern formed on the mask is transferred onto a substrate mounted on the substrate stage. This makes it possible to improve the exposure precision.

In the second exposure apparatus of the present invention, the driving unit can be used as a first driving unit in the shape measuring unit. In this case, there is no need to prepare a separate driving unit for the shape measuring unit, the overall arrangement of the exposure apparatus can be simplified.

In addition, the measurement light beams applied on the reflecting surface facing the tilt detection system are two light beams which are vertically incident on the reflecting surface facing the tilt detection system along the reference plane, and the two light beams are used to measure a local rotation amount of the reflecting surface around a first axis in the shape measuring unit. This makes it possible to perform the above two-beam measurement. In addition, the measurement light beams applied on the reflecting surface facing the tilt detection system are two light beams which are vertically incident on the reflecting surface facing the tilt detection system along the reference plane, the two light beams and one of the tilt detection light beams are three light beams which are arranged at different intervals and vertically incident on the reflecting surface facing the tilt detection system along a plane parallel to the reference plane, and the three light beams are used to measure a local rotation amount of the reflecting surface around a first axis in the shape measuring unit. This makes it possible to perform the above three-beam measurement.

The second exposure apparatus of the present invention can be configured such that the apparatus further comprises a mark detection system for detecting a position of a mark formed on at least one of the substrate table and the substrate, and the control system corrects a one-dimensional shape measurement result of the reflecting surface on the basis of a position detection result on the mark obtained by the mark detection system. In this case, since the offset between the respective one-dimensional shape measurement results on the respective reflecting surfaces can be corrected, the shape of each reflecting surface can be measured very accurately.

In the second exposure apparatus of the present invention, at least two reflecting surfaces can be two surfaces perpendicular to each other. In addition, a substrate mount surface of the substrate table can have a triangular shape, and at least two reflecting surfaces can be respectively formed on at least two side surfaces of the substrate table.

The second exposure apparatus of the present invention can be configured so that the apparatus further comprises a leveling detection system for detecting a position of the surface of the substrate in a direction perpendicular to the reference plane and a tilt of the surface with respect to the reference plane, and the control system controls a posture of the substrate table and a position of the substrate table in a direction perpendicular to the reference plane on the basis of leveling information detected by the leveling detection system, and also controls a position of the substrate table within the reference plane on the basis of two-dimensional position information detected by the two-dimensional position detection system, tilt information detected by the tilt detection system, and the shape information. In this case, in control with six degrees of freedom for the position and posture of the substrate table, control with three degrees of freedom is performed on the posture of the substrate table and its position in a direction perpendicular to the reference plane on the basis of the leveling information detected by the leveling detection system, and control with three degrees of freedom is performed on the two-dimensional position and yawing of the substrate table on the basis of the two-dimensional position information detected by the two-dimensional position detection system and the shape information. In addition, correction control can be performed on Abbe errors associated with the two-dimensional position of the substrate table.

According to the seventh aspect of the present invention, there is provided a method of producing an exposure apparatus for transferring a pattern formed on a mask mounted on a mask stage onto a substrate mounted on a substrate stage, characterized by comprising the first step of providing the shape measuring unit of the present invention, which uses at least one of the mask stage and the substrate stage as a moving object; the second step of providing a two-dimensional position detection system for irradiating a reflecting unit, which is mounted on the moving object and includes the reflecting surface, with two-dimensional position detection light beams, and detecting a two-dimensional position of the moving object on the basis of light beams reflected by the reflecting unit; the third step of providing a tilt detection system for irradiating the reflecting surface with at least two tilt detection light beams within a plane parallel to the reference plane, and detecting a tilt amount of the reflecting surface with respect to the reference plane on the basis of light beams reflected by the reflecting surface; and the fourth step of providing a control system for controlling at least one of a position and posture of the moving object on the basis of shape information of the reflecting surface measured in advance by the shape measuring unit, two-dimensional position information detected by the two-dimensional position detection system, and tilt information detected by the tilt detection system. According to this method, the first exposure apparatus of the present invention can be produced by mechanically, optically, and electrically combining various components, e.g., a mask stage, substrate stage, shape measuring unit, two-dimensional position detection system, tilt detection system, and control system, and adjusting the resultant structure.

According to the eighth aspect of the present invention, there is provided a method of producing an exposure apparatus for transferring a pattern formed on a mask onto a substrate, characterized by comprising, the first step of providing a substrate table which holds the substrate and has at least two reflecting surfaces extending in intersecting directions; the second step of providing a driving system for driving the substrate table; the third step of providing a two-dimensional position detection system for irradiating at least two reflecting surfaces with measurement light beams and detecting a two-dimensional position of the substrate table on the basis of light beams reflected by the reflecting surfaces; the fourth step of providing a tilt detecting system for irradiating at least one of at least two reflecting surfaces with at least two tilt detection light beams that are not in the same plane and are parallel to the reference plane, and detecting a tilt amount of the reflecting surface with respect to the reference plane on the basis of light beams reflected by the reflecting surface; the fifth step of providing the, shape measuring unit of the present invention, which measures a shape of a reflecting surface facing the tilt detection system; the sixth step of providing a storage unit for storing shape information of the reflecting surface facing the tilt detection system, which is measured by the shape measuring unit; and the seventh step of providing a control system for controlling the shape measuring unit and also controlling at least one of a position and posture of the substrate table on the basis of two-dimensional position information detected by the two-dimensional position detection system, tilt information detected by the tilt detection system, and the shape information.

According to this method, the second exposure apparatus of the present invention can be produced by mechanically, optically, and electrically combining various components, e.g., a substrate stage, driving system, two-dimensional position detection system, tilt detection system, storage unit, and control system, and adjusting the resultant structure.

The method of producing the second exposure apparatus of the present invention can further include the eighth step of providing the a mark detection system for detecting a position of a mark formed on at least one of said substrate table and the substrate. In this case, an exposure apparatus can be produced, in which the offsets caused between the respective one-dimensional shape measurement results on the respective reflecting surfaces can be corrected, and the shape of each reflecting surface can be measured very accurately.

The method producing the second exposure apparatus of the present invention can further include the ninth step of providing a leveling detection system for detecting a position of a surface of the substrate in a direction perpendicular to the reference plane and a tilt of the surface with respect to the reference plane. In this case, an exposure apparatus can be produced, in which in control with six degrees of freedom for the position and posture of the substrate table, correction control on Abbe errors associated with the two-dimensional position of the substrate table can be performed on the basis of the tilt information detected by the tilt detection system and the shape information.

A device having a fine pattern can be manufactured by transferring a predetermined pattern onto a substrate by exposure using the exposure apparatus of the present invention in a lithography process. According to another aspect, the present invention includes a device manufactured by using the exposure apparatus of the present invention. In addition, the present invention includes a method of manufacturing a device by transferring a predetermined pattern onto the substrate by using the exposure apparatus produced according to the making method of an exposure apparatus of the present invention in a lithography process.

BEST MODE FOR CARRYING OUT THE INVENTION

An embodiment of the present invention will be described below with reference to FIGS. 1 to 18.

Figure 1:
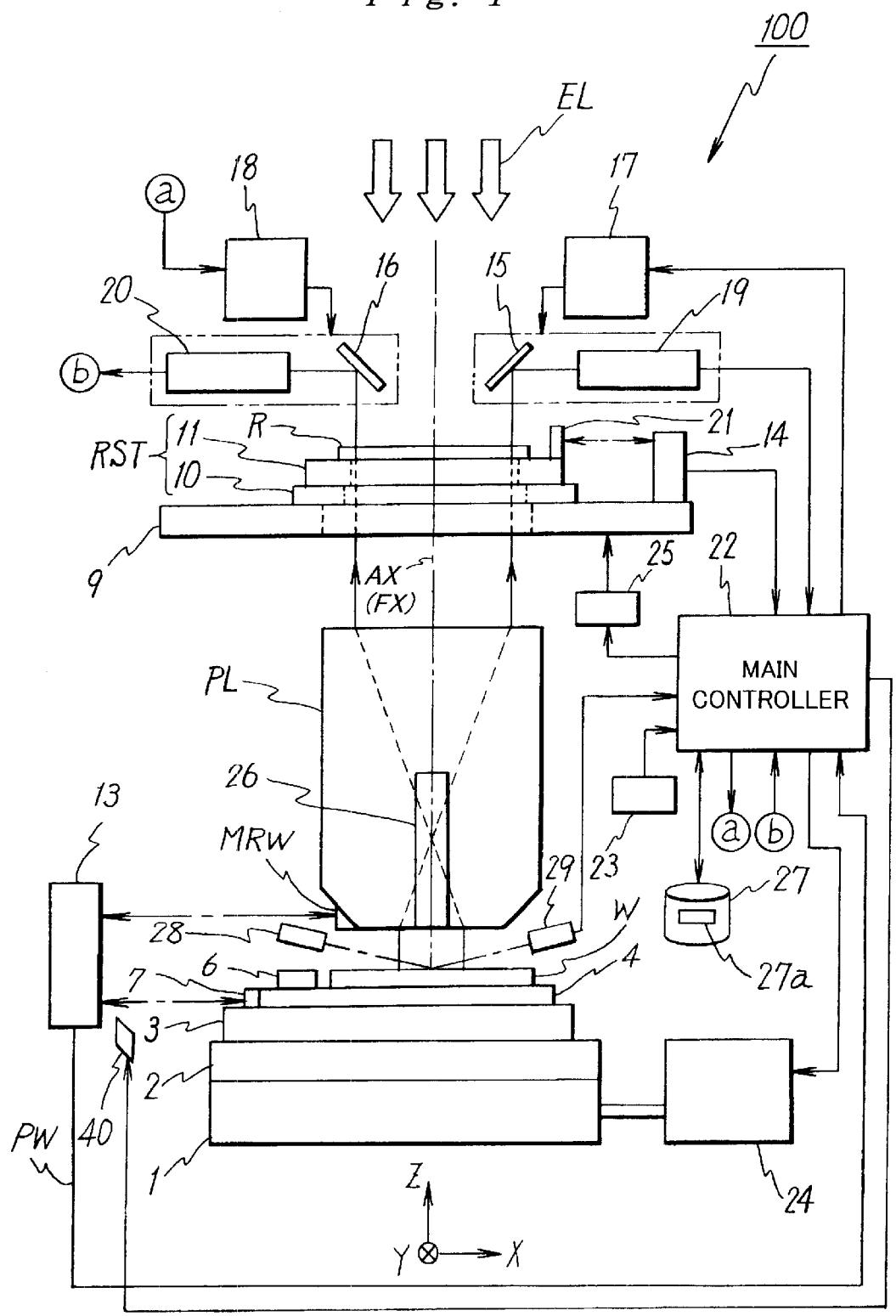
FIG. 1 is a schematic view showing the arrangement of an exposure apparatus according to an embodiment.

FIG. 1 shows the schematic arrangement of an exposure apparatus 100 according to an embodiment. The exposure apparatus 100 is a so-called step-and-scan type scanning exposure apparatus. This exposure apparatus 100 includes an illumination system (not shown) for uniformly illuminating a slit-like (rectangular or arcuated) illumination area on a reticle R serving as a mask, a reticle stage RST serving as a mask stage for holding a reticle, a projection optical system PL for projecting a pattern formed on the reticle R onto a wafer W serving as a substrate having a surface coated with a photoresist, a wafer stage unit including a substrate table 4 for holding the wafer W, and a control system for these components.

The illumination system is comprised of a light source unit, shutter, secondary source forming optical system, beam splitter, condenser lens system, reticle blind, imaging lens system, and the like (none of which are shown). The arrangement and the like of this illumination system are disclosed in Japanese Patent Laid-Open No. 9-320956. As this light source unit, one of the following light sources is used: a KrF excimer laser source (oscillation wavelength: 248 nm), ArF excimer laser source (oscillation wavelength: 193 nm), $F_2$ excimer laser source (oscillation wavelength: 157 nm), $Kr_2$ (krypton dimer) laser source (oscillation wavelength: 146 nm), $Ar_2$ (argon dimer) laser source (oscillation wavelength: 126 nm), copper vapor laser source or YAG laser harmonic generator, ultra-high pressure mercury lamp (e.g., a g line or i line), and the like.

The reticle stage RST has a reticle scanning stage 10 that can move on a reticle base 9, placed in a horizontal position below the illumination optical system, with predetermined strokes in a predetermined scanning direction (the Y direction perpendicular to the drawing surface of FIG. 1 in this case), and a reticle fine adjustment stage 11 that can be finely driven in the X and Y directions with respect to the reticle scanning stage 10 and a rotational direction ($\theta_Z$ direction) around the Z-axis. The reticle R is fixed on this reticle fine adjustment stage 11 by vacuum chucking, electrostatic chucking, or the like. The X-, Y-, and $\theta_Z$-direction positions of the reticle fine adjustment stage 11 are always monitored by a reticle laser interferometer (to be referred to as a "reticle interferometer" hereinafter) 14 placed on the reticle base 9. As will be described later, an X-axis reflecting mirror 21X1 and two Y-axis reflecting mirrors (cube corner prisms) 21Y1 and 21Y2 are fixed on the reticle fine adjustment stage 11, and the reticle interferometer 14 is constituted by laser interferometers 14X1, 14X2, 14Y1, and 14Y2 (see FIG. 11) accordingly. FIG. 1 representatively shows them as a reflecting mirror 21 and the reticle interferometer 14, respectively.

The position information (or velocity information) of the reticle fine adjustment stage 11, obtained by the reticle interferometer 14, is supplied to a main control system 22 for controlling the operation of the overall apparatus. The main control system 22 controls the operations of the reticle scanning stage 10 and reticle fine adjustment stage 11 through a reticle driving unit 25 including a linear motor for driving the reticle scanning stage 10 and a voice coil motor for driving the reticle scanning stage 10.

As the projection optical system PL, a two-sided telecentric refraction optical system having a predetermined reduction magnification β (e.g., ¼ or ⅕) is used. The direction of an optical axis AX of this projection optical system is assumed to be the Z direction perpendicular to the X-Y plane.

An off-axis alignment sensor (to be referred to as an "alignment sensor" hereinafter) 26 based on an image processing scheme for the observation of alignment marks (wafer marks) formed on each shot area SA (see FIG. 2) on the wafer W is placed on the side surface portion of the projection optical system PL in the Y direction. An optical axis FX of the optical system of this alignment sensor 26 is set to be parallel to the optical axis AX of the projection optical system. The detailed arrangement of this alignment sensor 26 is disclosed in, for example, Japanese Patent Laid-Open No. 9-219354 and U.S. Pat. No. 5,859,707 corresponding thereto. The above disclosures are incorporated herein by reference within the bounds of the domestic laws of the nations designated or selected by this international application. Note that a mark detection system is formed by the alignment sensor 26.

The wafer stage unit includes a wafer Y-axis driving stage 2 which is placed below the projection optical system PL and can move on a wafer base 1 in the Y direction, a wafer X-axis driving stage 3 which can move on the wafer Y-axis driving stage 2 in the X direction (the lateral direction on the drawing surface of FIG. 1) perpendicular to the Y direction, and a substrate table (Zθ-axis driving stage) 4 which is placed on the wafer X-axis driving stage 3 and can finely move in the Z direction (including rotation around the X- and Y-axes) and rotate around the Z-axis. The wafer W is held on the substrate table 4 by vacuum chucking, electrostatic chucking, or the like.

A reflecting mirror 7 is provided on a side surface of the substrate table 4. The positions of the substrate table 4 (wafer W) in the X direction, Y direction, and rotational direction around the Z-axis ($\theta_Z$ direction) are monitored by a wafer laser interferometer (to be referred to as a "wafer interferometer") 13 placed outside the substrate table 4, and the position information obtained by the wafer interferometer 13 is also supplied to the main control system 22. Although an X-axis reflecting mirror 7X and Y-axis reflecting mirror 7Y (see FIG. 2) are fixed on side surfaces of the substrate table 4, as will be described later, FIG. 1 representatively shows the reflecting mirrors 7X and 7Y as the reflecting mirror 7. The wafer interferometer 13 is comprised of laser interferometers 13X1, 13X2, 13Y1, 13Y2, and 13FX serving as a two-dimensional position detection system for projecting biaxial laser beams onto the reflecting mirrors 7X and 7Y to detect the X-Y position of the substrate table 4 and laser interferometers 13XP, 13YP and 13FP serving as a tilt detection system for projecting biaxial laser beams onto the reflecting mirrors 7X and 7Y to detect the tilt of the substrate table 4 with respect to the X-axis (rotational angle around the Y-axis) (see FIG. 2). FIG. 1 representatively shows these laser interferometers as the wafer interferometer 13.

A reticle reference mirror (not shown) which is irradiated by the reticle interferometer 14 with a reference light beam and an wafer reference mirror MRW which is irradiated by the wafer interferometer 13 with a reference light beam are fixed in the lens barrel of the projection optical system PL. Note that the wafer reference mirror MRW is constituted by an X-axis wafer reference mirror MRWX (see FIG. 3) which is irradiated by the laser interferometers 13X1 and 13X2 with reference light beams, and a Y-axis wafer reference mirror (not shown) which is irradiated by the laser interferometers 13Y1 and 13Y2 with reference light beams. FIG. 1 representatively shows the X-axis wafer reference mirror MRWX and Y-axis wafer reference mirror as the wafer reference mirror MRW. Similar to the wafer reference mirror, the reticle reference mirror is constituted by an X-axis reticle reference mirror which is irradiated by the reticle reference mirror 14X, and a Y-axis reticle reference mirror (none of which are shown) which is irradiated by the laser interferometers 14Y1 and 14Y2 with reference light beams.

An alignment reference mirror (not shown) which is irradiated by the laser interferometer 13FX with a reference light beam is fixed on the alignment sensor 26.

The exposure apparatus 100 in FIG. 1 also includes a multiple focal position detection system as a leveling detection system, i.e., one of the focus detection systems (focal point detection systems) based on the oblique incident light scheme, which is constituted by a light-transmitting system 28 and light-receiving system 29 to detect the Z-direction (the direction of the optical axis AX) positions of a portion in an exposure area and its neighboring area on the surface of the wafer W. The detailed arrangement of this multiple focal position detection system (28, 29) is disclosed in, for example, Japanese Patent Laid-Open No. 6-283403 and U.S. Pat. No. 5,448,332 corresponding thereto. The above disclosures are incorporated herein by reference within the bounds of the domestic laws of the nations designated or selected by this international application.

The Z-direction position information from the above multiple focal position detection system (28, 29) is supplied to the main control system 22. On the basis of the position information supplied from the wafer interference system 13 and multiple focal position detection system (28, 29), the main control system 22 performs position control on the wafer W in the X-, Y-, and Z-axis directions and rotational directions around the X-, Y-, and Z-axes by controlling the operations of the wafer Y-axis driving stage 2, wafer X-axis driving stage 3, and substrate table 4 through a wafer driving unit 24 which includes the linear motor for driving the wafer Y-axis driving stage 2, the linear motor for driving the wafer X-axis driving stage 3, the voice coil motor for driving the substrate table 4, and the like.

Note that the wafer stage unit may be comprised of the wafer base 1 and substrate table 4, and the wafer driving unit 24 may include a planar motor.

A reference mark plate 6 is fixed on the substrate table 4 near the wafer W. The surface of the reference mark plate 6 is flush with the surface of the wafer W. Various reference marks such as alignment reference marks (to be described later) are formed on the surface of this plate.

A pair of reticle alignment systems 19 and 20 are arranged above the reticle R in FIG. 1. Although not shown in FIG. 1, each of these reticle alignment systems 19 and 20 is comprised of an incident illumination system for illuminating a mark as a detection target with illumination light having the same wavelength as that of exposure light EL, and an alignment microscope for picking up an image of the mark as the detection target. The alignment microscope includes an imaging optical system and image sensing element. In this case, movable deflecting mirrors 15 and 16 are movably arranged to guide detection light from the reticle R to the reticle alignment systems 19 and 20, respectively. When an exposure sequence is started, the deflecting mirrors 15 and 16 are retracted out of the optical path of the exposure light EL, together with the reticle alignment systems 19 and 20, by driving units 17 and 18.

The apparatus in FIG. 1 further includes an optical path changing plate 40 serving as an optical path changing unit for changing the optical paths of light beams sent out from the laser interferometers 13X1, 13X2, 13Y1, and 13Y2 to the reflecting mirrors 7X and 7Y. This optical path changing plate 40 will be described later.

The main control system 22 is formed by a microcomputer, workstation, or the like and designed to control the overall apparatus. In scanning exposure, the main control system 22 controls the reticle driving unit 25 and wafer driving unit 24 to scan the wafer W in the +Y direction (or −Y direction) perpendicular to the drawing surface of FIG. 1 at a constant velocity V and synchronously scan the reticle R in the −Y direction (or +Y direction) at a constant velocity V/β. An input unit 23 that is used by an operator to input various commands and the like is connected to the main control system 22. In this embodiment, a storage unit 27 storing operation parameters including shape information data 27a of the reflecting mirror 7 (the reflecting mirrors 7X and 7Y in practice; see FIG. 2) provided on the substrate table 4 is connected to the main control system 22.

The arrangements, etc. of the reticle interferometer 14 on the reticle stage RST side and wafer interferometer 13 on the wafer stage unit side will be described next with reference to FIGS. 2 to 11.

Figure 2:
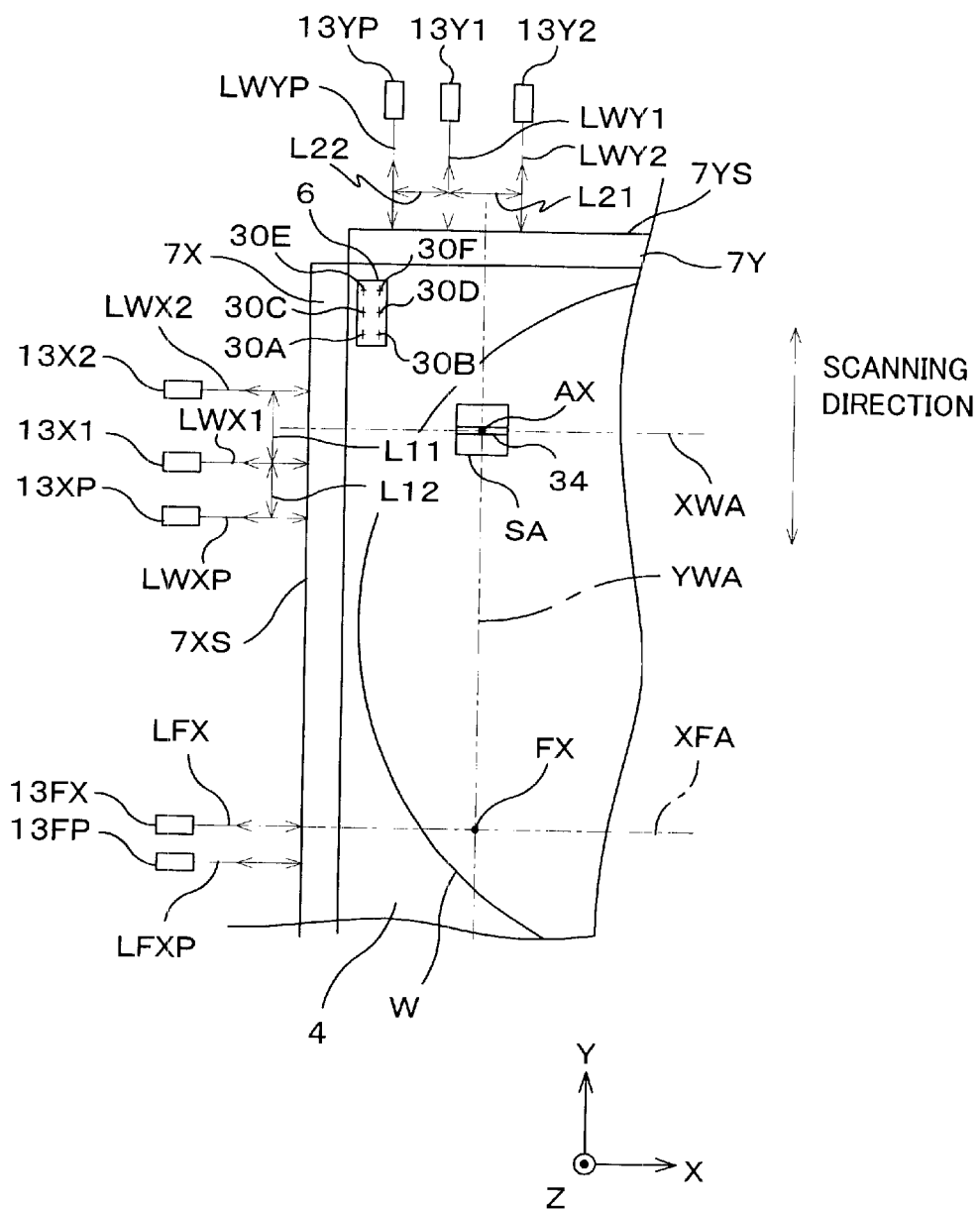
FIG. 2 is a view for explaining the arrangement of a substrate table and the positions of laser interferometers for detecting the position of the substrate table.

FIG. 2 is a planar view of the substrate table 4 and its surroundings. As shown in FIG. 2, the reference mark plate 6 is fixed on the substrate table 4 at a position near the wafer W. A set of reference marks 30A, 30B, 30C, 30D, 30E, and 30F for the alignment of the reticle R and a baseline measurement mark (not shown) are formed on the reference mark plate 6.

The X-axis reflecting mirror 7X extending in the Y direction and the Y-axis reflecting mirror 7Y extending in the X direction are respectively fixed to the side surfaces of the end portions of the substrate table 4 in the −X and +Y directions. An image of a portion of a pattern on the substrate table 4 is projected on a slit-like exposure area 34 on the wafer W. Observation areas for the reticle alignment systems 19 and 20 in FIG. 1 are arranged on two end portions of the exposure area 34 at a predetermined distance from each other.

The reflecting mirror 7X is irradiated with laser beams LWX1 and LWX2 which are apart from each other by a distance 11 along the Y-axis direction and parallel to the X-axis. In addition, the reflecting mirror 7X is irradiated with a pair of laser beams LWXP which are apart from each other by a distance DX along the Z-axis direction (see FIG. 8) and parallel to the X-axis. Note that the laser beams LWX1 and LWX2 are separated in the Y-axis direction with respect to an axis XWA which is parallel to the X-axis and crosses the optical axis AX of the projection optical system PL.

The reflecting mirror 7X is also irradiated with a laser beam LFX parallel to the X-axis and a pair of laser beams LFXP which are apart from each other by the distance DX along the Z-axis direction and parallel to the X-axis. Note that the laser beam LFX is incident onto the reflecting mirror 7X along an axis XFA which is parallel to the X-axis and crosses an optical axis FX of the alignment sensor 26.

The laser beams LWX1, LWX2, LWXP, LFX, and LFXP are respectively supplied from the laser interferometers 13X1, 13X2, 13XP, 13FX, and 13FP shown in FIG. 2. These laser interferometers 13X1, 13X2, 13XP, 13FX, and 13FP will be described with reference to FIGS. 3 to 10.

Figure 3:
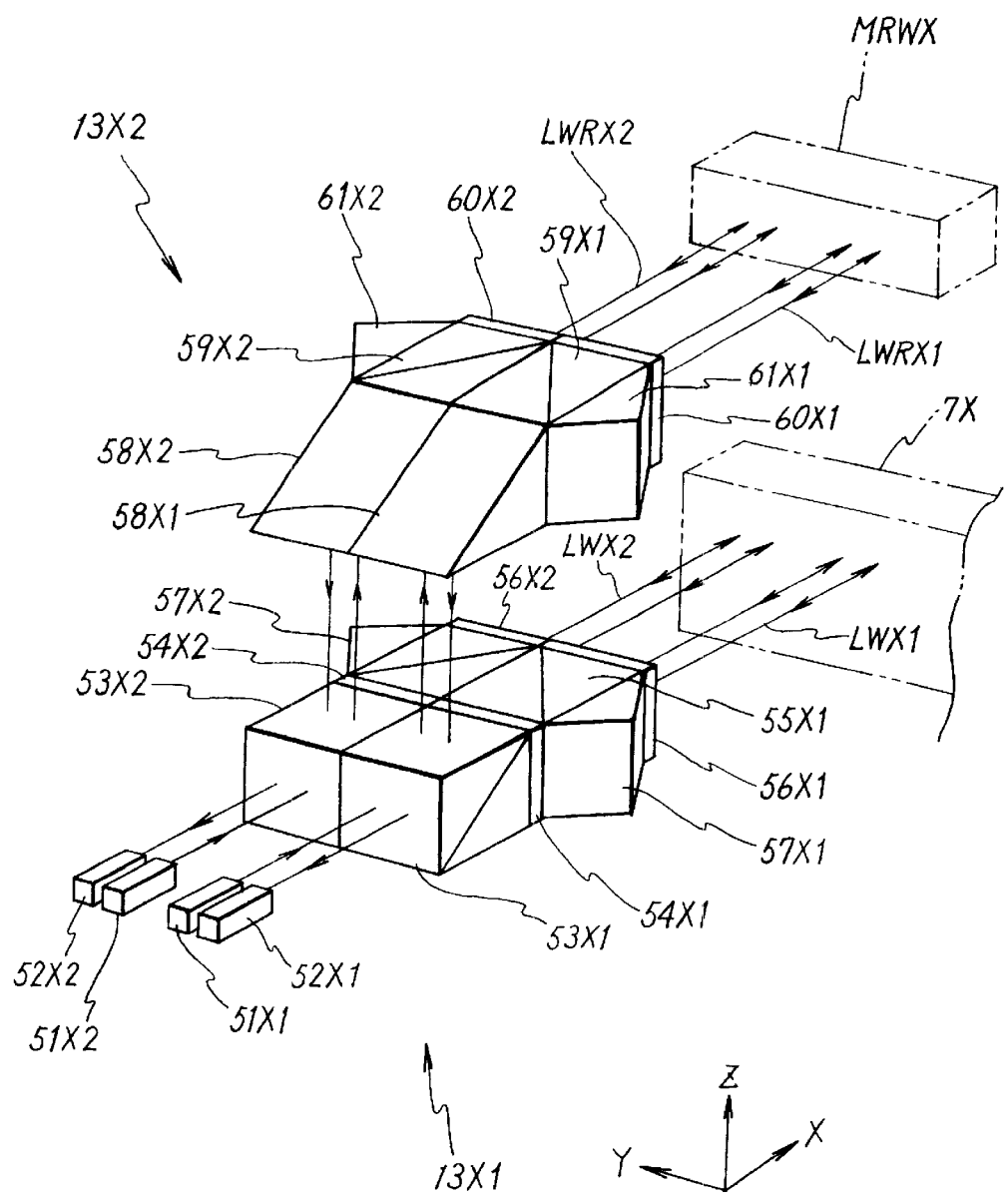
FIG. 3 is a schematic view showing the arrangement of laser interferometers for detecting the two-dimensional position of the substrate table.

As shown in FIG. 3, the laser interferometer 13X1 has a light source 51X1, light-receiving unit 52X1, polarizing beam splitter 53X1, half-wave plate 54X1, polarizing beam splitter 55X1, quarter-wave plate 56X1, reflecting prism (cube corner prism) 57X1, reflecting prism 58X1, polarizing beam splitter 59X1, quarter-wave plate 60X1, and reflecting prism (cube corner prism) 61X1.

The function of the laser interferometer 13X1 will be described. As shown in FIG. 3, in the laser interferometer 13X1, the light source 51X1 emits a light beam propagating in the +X direction. In this case, as the light source 51X1, for example, a two-frequency laser using the Zeeman effect is used. This laser outputs a laser light beam consisting of first and second polarized light components whose frequencies (i.e., wavelengths) are slightly different from each other and polarization directions are perpendicular to each other. Note that the first polarized light component is a vertically polarized component (V-polarized light) and the second polarized light component is horizontally polarized light component (H-polarized light).

Figure 4:
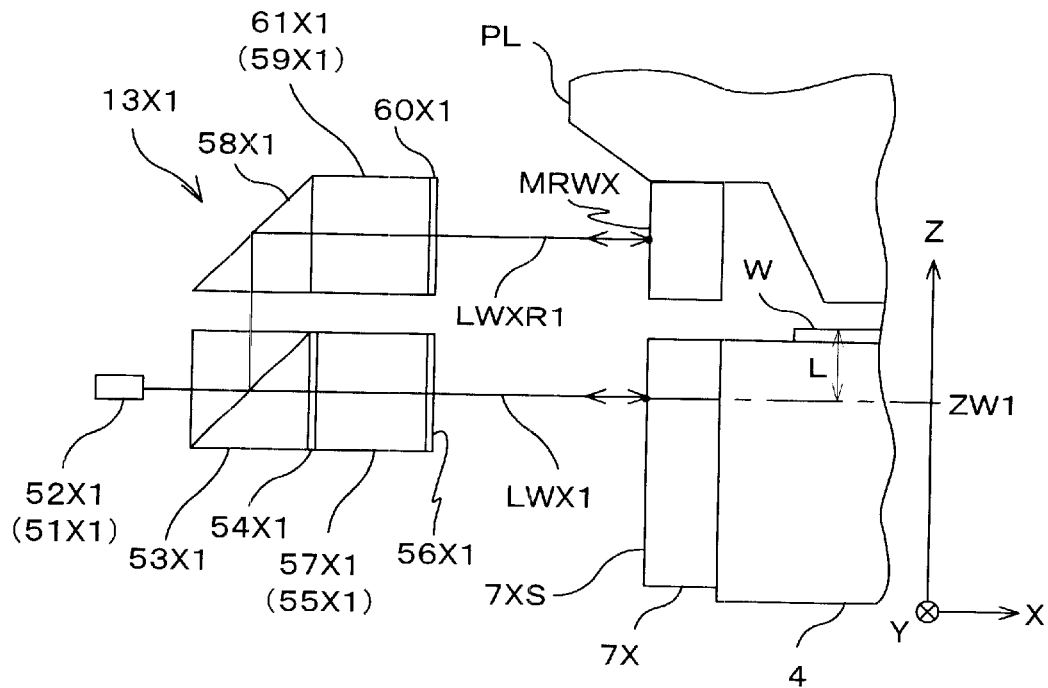
FIGS. 4 to 6 are views for explaining optical paths in the laser interferometers in FIG. 3.

As shown in FIG. 4, the light beam emitted from the light source 51X1 is incident on the polarizing beam splitter 53X1 and split into two light beams in accordance with polarization directions. More specifically, the light beam LWX1 constituted by the first polarized light component emitted from the light source 51X1 is transmitted through the polarizing beam splitter 53X1 and propagates in the +X direction. A light beam LWXR1 constituted by the second polarized light component is deflected by the polarizing beam splitter 53X1 and propagates in the +Z direction.

Figure 5:
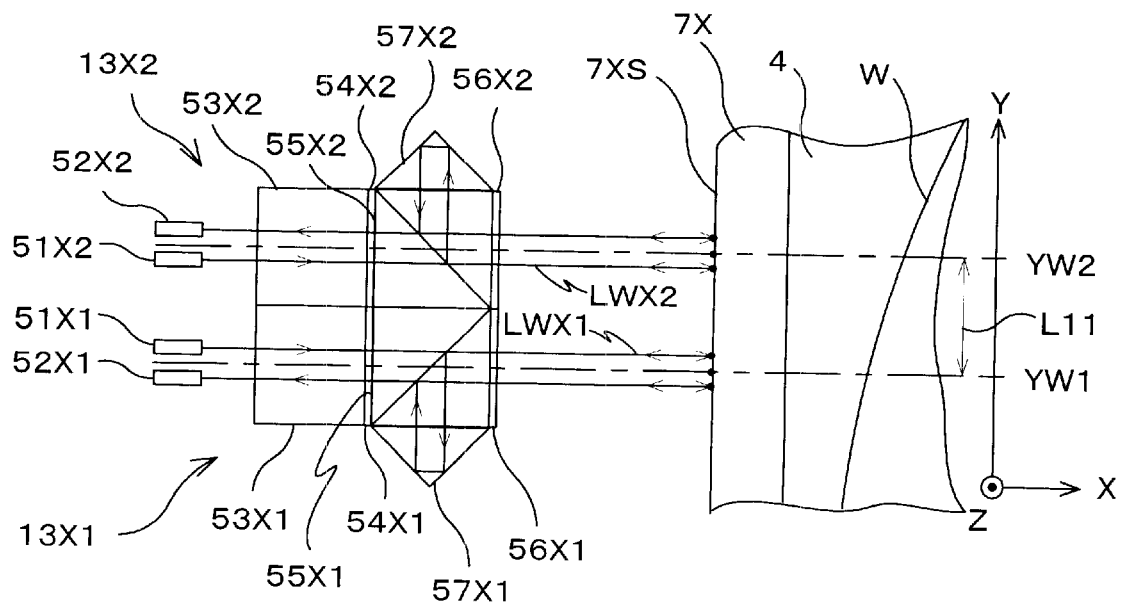

As shown in FIG. 5, the light beam LWX1 that has passed through the polarizing beam splitter 53X1 is incident on the polarizing beam splitter 55X1 with the polarization direction of the light beam being rotated through 90° by the half-wave plate 54X1, and the incident light is transmitted through the polarizing beam splitter 55X1. The light beam LWX1 transmitted through the polarizing beam splitter 55X1 is converted into circularly polarized light by the quarter-wave plate 56X1. This light strikes a point on a reflecting surface 7XS which has a Z position located at ZW1 and Y position located near YW1, and is reflected at this point. A light beam LXW1 reflected by the reflecting surface 7XS has the polarization direction of the beam rotated through 90° against that at the time, when sent out from the polarizing beam splitter 55X1, by the quarter-wave plate 56X1, and returns to the polarizing beam splitter 55X1. The light beam LWX1 is then deflected by the polarizing beam splitter 55X1 and propagates in the −Y direction.

The light beam LXW1 that has propagated in the −Y direction in this manner is reflected by the reflecting prism 57X1 having the function of a cube corner prism and strikes the polarizing beam splitter 55X1 again. The light beam LWX1 that has struck the polarizing beam splitter 55X1 from the reflecting prism 57X1 is deflected by the polarizing beam splitter 55X1 to propagate in the +X direction. This light beam is converted into circularly polarized light by the quarter-wave plate 56X1. Thereafter, the light strikes the point on the reflecting surface 7XS which has the Z position located at ZW1 and Y position located near YW1 and is reflected again. The polarization direction of the light beam LWX1 reflected by the reflecting surface 7XS again is rotated through 90° against that at the time, when sent out from the polarizing beam splitter 55X1, by the quarter-wave plate 56X1, and the light beam returns to the polarizing beam splitter 55X1 again to be transmitted through the polarizing beam splitter 55X1.

In this manner, the polarization direction of the light beam LWX1 transmitted through the polarizing beam splitter 55X1 is rotated through 90° via the half-wave plate 54X1, and the light beam is incident on the polarizing beam splitter 53X1. Thereafter, the light beam is transmitted through the polarizing beam splitter 53X1 and propagates as a measurement light beam toward the light-receiving unit 52X1.

Figure 6:
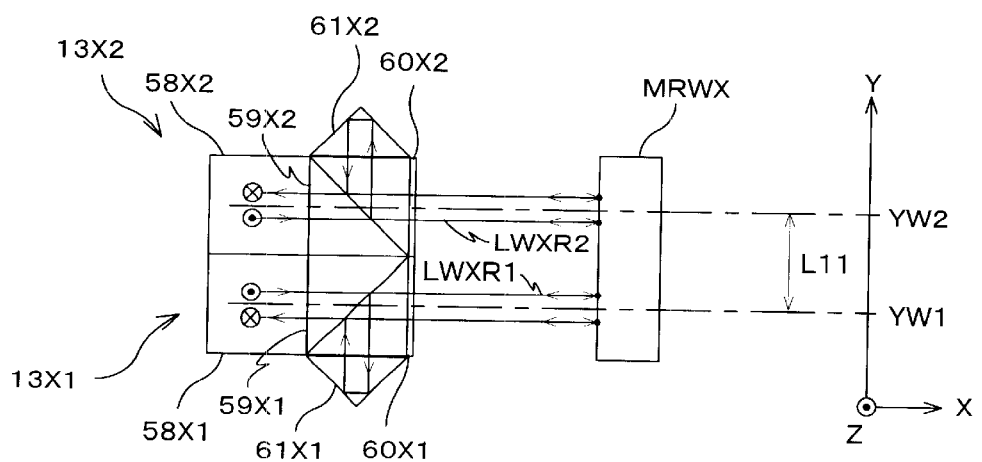

In the mean time, the light beam LWXR1 that has been deflected by the polarizing beam splitter 53X1 and has propagated in the +Z direction is reflected by the reflecting prism 58X1 and propagates in the +X direction. This light beam is then incident on the polarizing beam splitter 59X1. Subsequently, as shown in FIG. 6, in the same manner as in FIG. 5, the light beam is reflected twice by the X-axis wafer reference mirror MRWX via the polarizing beam splitter 59X1, quarter-wave plate 60X1, and reflecting prism 61X1, and emerges from the polarizing beam splitter 59X1 to strike the reflecting prism 58X1. After the light beam LWXR1 incident on the reflecting prism 58X1 is reflected by the reflecting prism 58X1 and propagates in the −Z direction, the light beam is deflected by the polarizing beam splitter 53X1 and propagates as a reference light beam toward the light-receiving unit 52X1 along almost the same optical path as that of the light beam LWX1 described above.

That is, the incident light beam on the light-receiving unit 52X1 is the composite light of the measurement light beam LWX1 and reference light beam LWXR1. The light-receiving unit 52X1 makes the measurement light beam LWX1 and reference light beam LWXR1 interfere with each other with their polarization directions being the same as each other so as to generate interference light reflecting the optical path length difference between the measurement light beam LWX1 and reference light beam LWXR1, and measures the interference state. The X-axis wafer reference mirror MRWX is fixed on the projection optical system PL, and the optical path length of a reference light beam that is emitted from the light source 51X1 and propagates to the light-receiving unit 52X1 via the X-axis wafer reference mirror MRWX is regarded constant. Therefore, the position in the length measurement direction (X-axis direction) of the irradiation point of the measurement light beam on the reflecting surface 7XS, i.e., the X position, is detected by measuring the interference state between the measurement light beam and the reference light beam. In practice, the laser interferometer 13X1 is reset in a predetermined state (e.g., a state in reticle alignment), and by setting the X-axis-direction position of the irradiation point of the measurement light beam on the reflecting surface 7XS in this reset state to be the coordinate origin in the X-axis direction, position detection is performed. The X position detected in the above manner will be referred to as "XW1" hereinafter.

Referring back to FIG. 3, the laser interferometer 13X2 is adjacent to the laser interferometer 13X1, and has the same arrangement as that of the laser interferometer 13X1. More specifically, as shown in FIG. 3, in the laser interferometer 13X2, constituent elements 51X2 to 61X2 corresponding to the constituent elements 51X1 to 61X1 of the laser interferometer 13X1 are arranged to be symmetrical about the adjoining plane between the laser interferometer 13X1 and 13X2.

In the laser interferometer 13X2, as in the laser interferometer 13X1, the position of the irradiation point of a measurement light beam (see FIG. 5) on the reflecting surface 7XS in the length measurement direction (X-axis direction) is detected by measuring the interference state between a measurement light beam (see FIG. 5) which is the reflection light of the light beam LWX2 reflected by the reflecting surface 7XS and propagates to the light-receiving unit 52X2 and a reference light beam (see FIG. 6) which is the reflection light of a light beam LWXR2 reflected by the X-axis wafer reference mirror MRWX and propagates to the light-receiving unit 52X2. The X position detected in the above manner will be referred to as "XW2" hereinafter.

Figure 7:
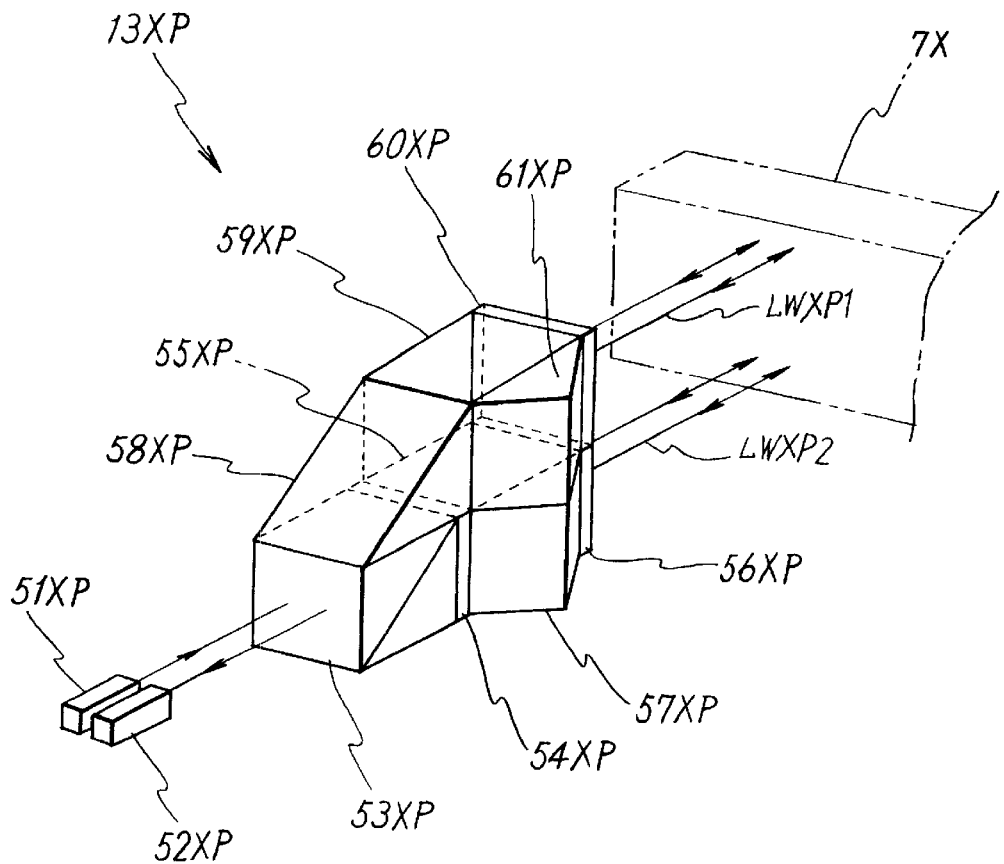
FIG. 7 is a schematic view showing the arrangement of a laser interferometer for detecting the tilt information of a reflecting surface.

As shown in FIG. 7, the laser interferometer 13XP includes a light source 51XP, light-receiving unit 52XP, polarizing beam splitter 53XP, half-wave plate 54XP, polarizing beam splitter 55XP, quarter-wave plate 56XP, reflecting prism (cube corner prism) 57XP, reflecting prism 58XP, polarizing beam splitter 59XP, quarter-wave plate 60XP, and reflecting prism (cube corner prism) 61XP. That is, the laser interferometer 13XP has the same constituent elements as those of the laser interferometer 13X1, but the respective constituent elements differ in their Z-axis-direction positions.

The function of the laser interferometer 13XP will be described below. In the laser interferometer 13XP, as shown in FIG. 7, the light source 51XP emits a light beam propagating in the +X direction. In this case, as the light source 51XP, for example, a two-frequency laser using the Zeeman effect is used like the light source 51X1 in the laser interferometer 13X1. The light source 51XP emits a laser beam, as a light beam LWXS1, which consists of first and second polarized light components whose frequencies (i.e., wavelengths) are slightly different from each other and polarization directions are perpendicular to each other. Note that the first polarized light component is a vertically polarized component (V-polarized light) and the second polarized light component is horizontally polarized light component (H-polarized light).

Figure 8:
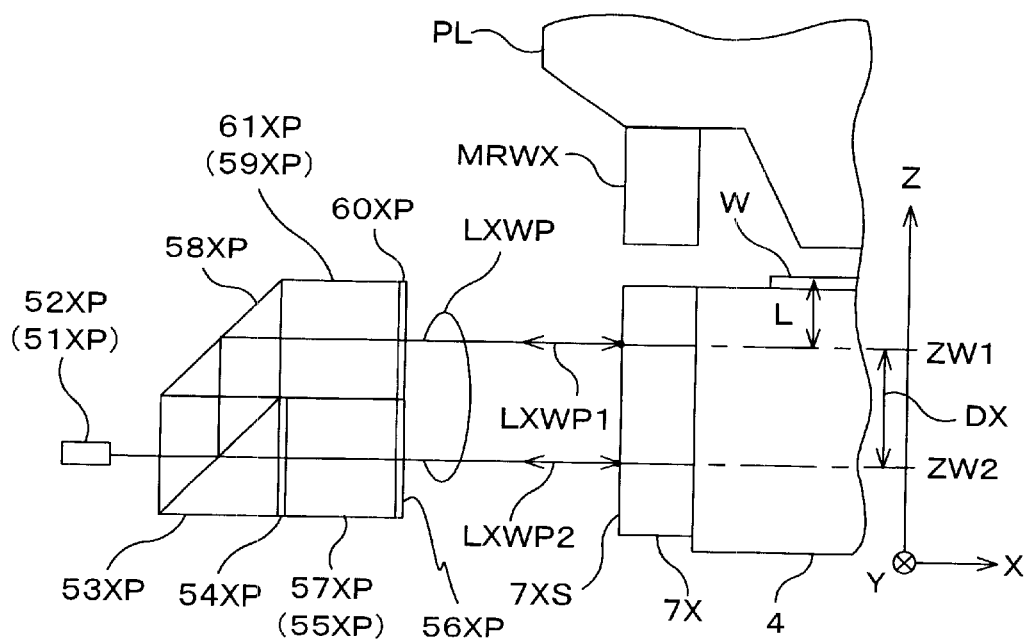
FIGS. 8 to 10 are views for explaining optical paths in the laser interferometer in FIG. 7.

As shown in FIG. 8, the light beam emitted from the light source 51XP is incident on the polarizing beam splitter 53XP and split into two light beams in accordance with polarization directions. More specifically, a light beam LWXP1 constituted by the first polarized light component emitted from the light source 51XP is transmitted through the polarizing beam splitter 53XP and propagates in the +X direction. A light beam LWXP2 constituted by the second polarized light component is deflected by the polarizing beam splitter 53XP and propagates in the +Z direction.

Figure 9:
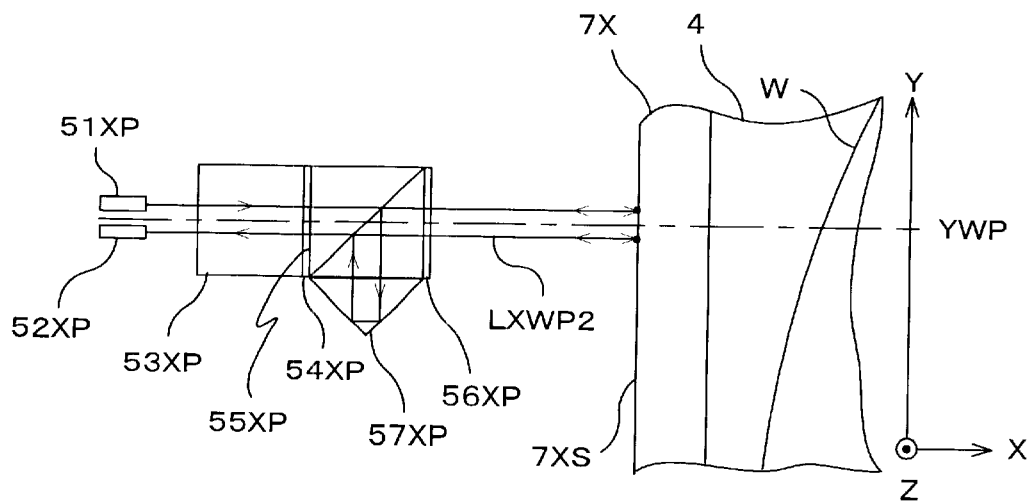

As shown in FIG. 9, as in the case of the laser interferometer 13X1, the light beam LWXP2 transmitted through the polarizing beam splitter 53XP strikes a point on the reflecting surface 7XS, which has a Z position located at ZW2(=ZW1−DX) and Y position located near YWP, after passing through the half-wave plate 54XP, polarizing beam splitter 55XP, and quarter-wave plate 56XP, and is reflected. The light beam LWXP2 reflected by the reflecting surface 7XS strikes the point on the reflecting surface 7XS, which has the Z position located at ZW2(=ZW1−DX) and Y position located near YWP, after passing through the quarter-wave plate 56XP, polarizing beam splitter 55XP, reflecting prism 57XP, and quarter-wave plate 56XP, and is reflected again. The light beam LWXP2 reflected by the reflecting surface 7XS again propagates as the first measurement light beam toward the light-receiving unit 52XP after passing through the quarter-wave plate 56XP, polarizing beam splitter 55XP, half-wave plate 54XP, and light-receiving unit 52XP.

Figure 10:
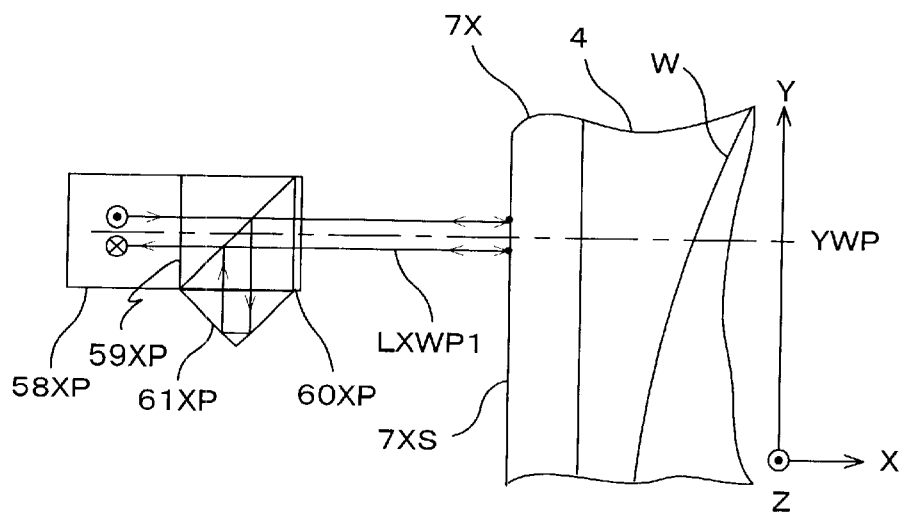

In the mean time, the light beam LWXP1, which has been deflected by the polarizing beam splitter 53XP and propagated in the +Z direction, is reflected by the reflecting prism 58XP to propagate in the +X direction and strikes the polarizing beam splitter 59XP. Subsequently, as shown in FIG. 10, as in the case of FIG. 9, the light beam is reflected twice near Y-Z coordinates (YWP, ZW1) on the reflecting surface 7XS while passing through the polarizing beam splitter 59X1, quarter-wave plate 60X1, and reflecting prism 61X1. Then, the light beam is sent out from the polarizing beam splitter 59XP and strikes the reflecting prism 58XP. The light beam LWXP1 that has struck the reflecting prism 58XP in this manner is reflected by the reflecting prism 58XP and propagates in the −Z direction. The light beam is then deflected by the light-receiving unit 52XP and propagates in the −X direction and toward the light-receiving unit 52XP as the second measurement light beam on almost the same optical path as that of the first measurement light beam.

That is, the light beam incident on the light-receiving unit 52XP becomes the composite light of the first and second measurement light beams. The light-receiving unit 52XP makes the first and second measurement light beams interfere with each other with their polarization directions being the same as each other so as to generate interference light reflecting the optical path length difference between the first and second measurement light beams, and measures the interference state. The rotation amount of the reflecting surface 7XS around the Y-axis is detected by the measurement of this interference state. As in the case of the laser interferometer 13X1, in practice, the laser interferometer 13XP is reset in a predetermined state (e.g., a state in reticle alignment), and regarding the rotation amount of the reflecting surface 7XS around the Y-axis as zero, in the reset state, the rotation amount of the reflecting surface 7XS around the Y-axis is detected. The tilt information detected by the laser interferometer 13XP will be referred to as "ΔLWXP" hereinafter.

Note that the laser beam LXW1, laser beam LXW2, and laser beam LXWP1 are arranged at the same Z position ZW1 in the Y-axis direction, and a distance L12 is set between the laser beam LXW1 and laser beam LXWP1 in the Y-axis direction, as shown in FIG. 2A.

Referring back to FIG. 2, the laser interferometer 13FX has the same arrangement as that of the laser interferometer 13X1 described above. In the laser interferometer 13FX, as in the laser interferometer 13X1, the position of the irradiation point of a measurement light beam on the reflecting surface 7XS in the length measurement direction (X-axis direction) is detected by measuring the interference state between the measurement light beam which is incident on the reflecting surface 7XS and reflected to propagate toward the light-receiving unit and a reference light beam which is incident on the X-axis wafer reference mirror MRWX and reflected to propagate toward the light-receiving unit. The X position detected in the above manner will be referred to as "XF" hereinafter.

The laser interferometer 13FP has the same arrangement as that of the laser interferometer 13XP. In the laser interferometer 13FP, as in the laser interferometer 13XP, the rotation amount of the reflecting surface 7XS around the Y-axis in a reset state is regarded as zero, and the rotation amount of the reflecting surface 7XS around the Y-axis is detected by measuring the interference state between the first and second measurement light beams which are incident on the reflecting surface 7XS and reflected to propagate toward the light-receiving unit. The tilt information detected by the laser interferometer 13FP will be referred to as "ΔLFXP" hereinafter.

The reflecting mirror 7Y is irradiated with laser beams LWY1 and LWY2 which are apart from each other by a distance L21 along the X-axis direction and parallel to the Y-axis. In addition, the reflecting mirror 7Y is irradiated with a pair of laser beams LWYP which are apart from each other by a distance DY (not shown) along the Z-axis direction and parallel to the X-axis. Note that the laser beams LWY1 and LWY2 are separated in the X direction with respect to an axis YWA which is parallel to the Y-axis and crosses the optical axis AX of the projection optical system PL.

The respective laser beams LWY1, LWY2, and LWYP are supplied from the laser interferometers 13Y1, 13Y2, and 13YP. The laser interferometers 13Y1 and 13Y2 have the same arrangement as that of the laser interferometers 13X1 and 13X2 described above except that the length measurement direction of the laser interferometers 13Y1 and 13Y2 coincides with the Y-axis direction, and they are arranged to be opposite with the reflecting mirror 7Y and Y-axis wafer reference mirror. Note that the detected Y positions of the laser interferometers 13Y1 and 13Y2 will be respectively referred to as "YW1" and "YW2" hereinafter. In addition, the laser interferometer 13YP has the same arrangement as that of the laser interferometer 13XP described above except that the length measurement direction of the laser interferometer 13YP coincides with the Y-axis direction, and it is placed to be opposite with the reflecting mirror 7Y. The tilt information detected by the laser interferometer 13YP will be referred to as "ΔLWYP" hereinafter.

The above reflecting mirrors 7X and 7Y are formed to be long enough to cover the laser beams LWX1, LWX2, LWXP, LWY1, LWY2, and LWYP during scanning exposure for the wafer W or position control such as stepping operation and also cover the laser beams LFX, LFXP, LWY1, LWY2, and LWYP during alignment measurement for the wafer W by the alignment sensor 26.

The X-Y position (XW, YW) of the substrate table 4 during scanning exposure or position control such as stepping operation, i.e., the X-Y position of the wafer W, is detected by the laser interferometers 13X1, 13X2, 13Y1, and 13Y2. An X position XW of the substrate table 4 is detected on the basis of X position measurement results XW1 and XW2 obtained by the laser interferometers 13X1 and 13X2 according to $$XW=(XW1+XW2)/2 \qquad (3)$$

A Y position YW of the substrate table 4 is also detected on the basis of Y position measurement results YW1 and YW2 obtained by the laser interferometers 13Y1 and 13Y2 according to $$YW=(YW1+YW2)/2 \qquad (4)$$

The X-Y position (XW(=XF), YW) of the substrate table 4, i.e., the X-Y position of the wafer W, during alignment measurement is detected by the laser interferometers 13FX, 13Y1, and 13Y2. More specifically, an X position measurement result XF by the laser interferometer 13FX is detected as the X position XW of the substrate table 4. In addition, a Y position YW of the substrate table 4 is detected on the basis of the Y position measurement results YW1 and YW2 obtained by the laser interferometers 13Y1 and 13Y2.

A yawing amount $\theta_{ZW}$ of the substrate table 4 is detected on the basis of the measurement values XW1 and XW2 or measurement values YW1 and YW2 according to $$\theta_{ZW}=(XW1-XW2)/L11 \qquad (5)$$

$$\theta_{ZW}=(YW1-YW2)/L21 \qquad (5').$$

That is, the yawing amount $\theta_{ZW}$ of the substrate table 4 is detected from the local rotational angle of the reflecting surface 7XS around the Z-axis between the irradiation points of the measurement light beams LWX1 and LWX2 on the reflecting surface 7XS or the local rotational angle of a reflecting surface 7YS around the Z-axis between the irradiation points of the measurement light beams LWY1 and LWY2 on the reflecting surface 7YS.

An orthogonality error variation $\Delta\omega_W$ of the substrate table 4 is also detected with respect to the reset state of the reflecting mirrors 7X and 7Y on the basis of the measurement values XW1, XW2, YW1, and YW2 according to $$\Delta\omega_W=(YW1-YW2)/L21-(XW1-XW2)/L11 \qquad (6)$$

That is, the orthogonality error variation $\Delta\omega_W$ of the substrate table 4 with respect to the reset state of the reflecting mirrors 7X and 7Y is detected from the difference between the local rotational angle of the reflecting surface 7XS around the Z-axis between the irradiation points of the measurement light beams LWX1 and LWX2 on the reflecting surface 7XS and the local rotational angle of the reflecting surface 7YS around the Z-axis between the irradiation points of the measurement light beams LYX1 and LYX2 on the reflecting surface 7YS.

The coordinate system constituted by the X-coordinate XW and Y-coordinate YW detected in the above manner will be referred to as a wafer stage coordinate system (XW, YW) hereinafter. This coordinate system (XW, YW) is a value with respect to the reset state, and differs from an ideal design orthogonal coordinate system constituted by X- and Y-axes to a certain degree. However, this coordinate system is calibrated under predetermined conditions, and then the wafer W is moved on the basis of the calibrated new wafer stage coordinate system (XW, YW).

Figure 11:
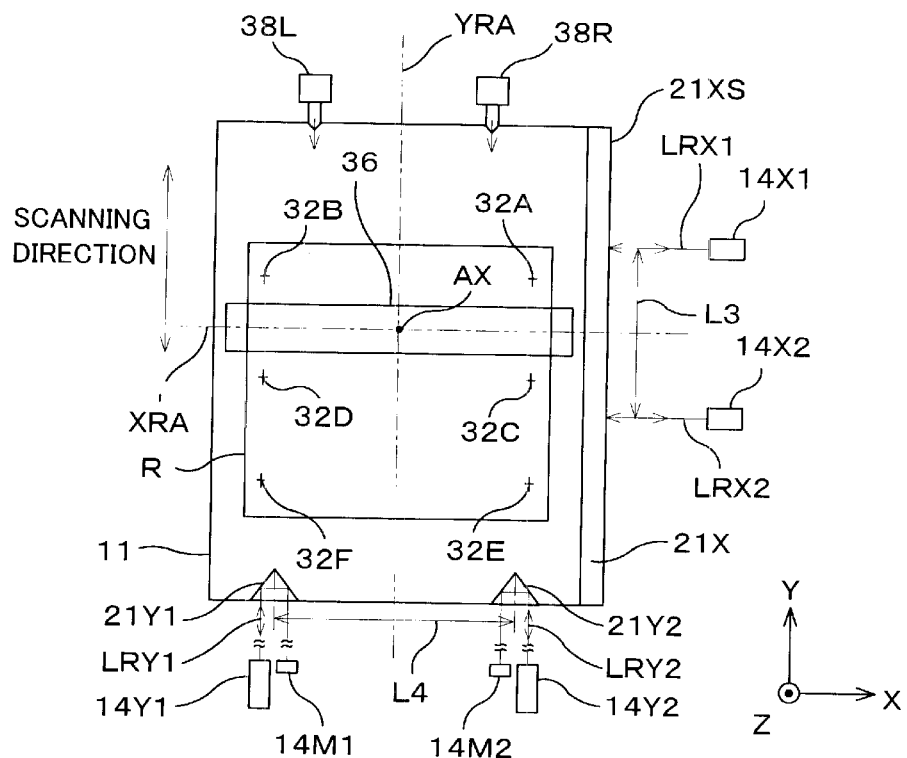
FIG. 11 is a view for explaining the arrangement of a reticle fine adjustment stage and the positions of laser interferometers for detecting the position of the reticle fine adjustment stage.
Figure 12:
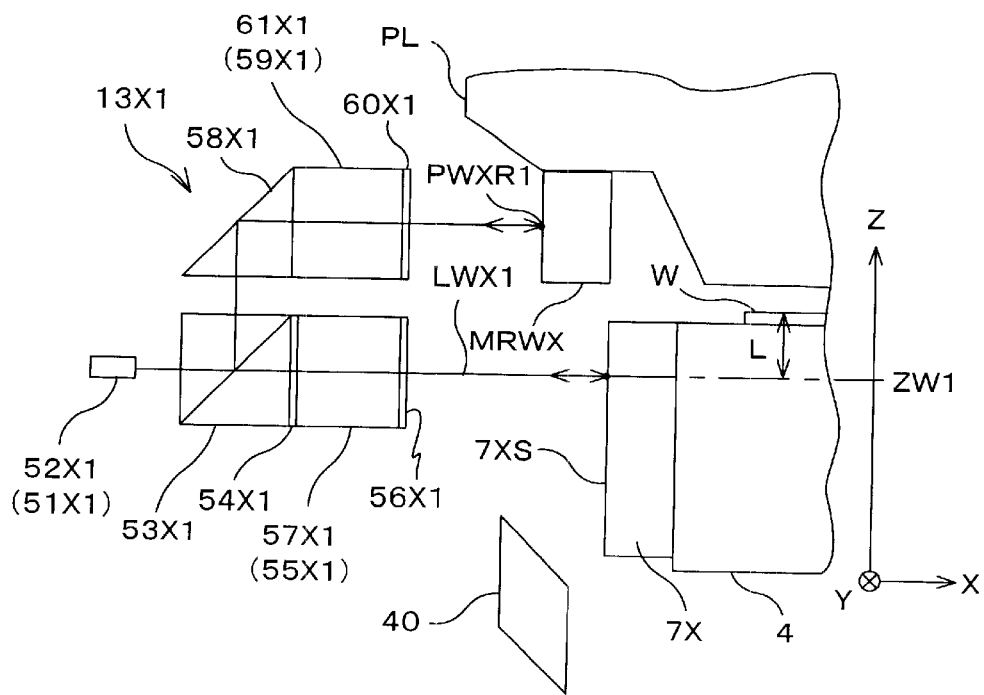
FIG. 12 is a view for explaining the movement of the substrate table and reference marks in one-dimensional shape measurement.

FIG. 11 is a planar view showing the surroundings of the reticle fine adjustment stage 11. As shown in FIG. 11, the reticle R is held on the reticle fine adjustment stage 11. The X-axis reflecting mirror 21X extending in the Y direction and the two Y-axis reflecting mirrors 21Y1 and 21Y2 formed by cube corner prisms are respectively fixed on the +X-direction end portion and −Y-direction end portion of the reticle fine adjustment stage 11. The reticle fine adjustment stage 11 is driven by actuators 38L and 38R using voice coil motors as driving sources under the control of the main control system 22.

The reflecting mirror 21X is irradiated with laser beams LRX1 and LRX2 which are apart from each other by a distance L3 in the Y-axis direction and parallel to the X-axis. Note that the laser beams LRX1 and LRX2 are separated in the Y-axis direction with respect to an axis XRA which is parallel to the X-axis and passes through the optical axis AX of the projection optical system PL. The reflecting mirror 21Y1 is irradiated with laser beams LRY1 and LRY2 which are apart from each other by the distance L3 in the X-axis direction and parallel to the Y-axis. Note that the laser beams LRY1 and LRY2 are separated in the X-axis direction with respect to an axis YRA which is parallel to the Y-axis and crosses the optical axis AX of the projection optical system PL.

The laser beams LRX1, LRX2, LRY1, and LRY2 are respectively supplied from the reticle interferometers 14X1, 14X2, 14Y1, and 14Y2. The X position of the reticle fine adjustment stage 11 is detected on the basis of the measurement values obtained by the reticle interferometers 14X1 and 14X2. The Y position of the reticle fine adjustment stage 11 is detected on the basis of the measurement values obtained by the reticle interferometers 14Y1 and 14Y2.

The reticle interferometers 14X1 and 14X2 have the same arrangement as that of the laser interferometers 13X1 and 13X2 described above except that they are placed to be opposite with the reflecting mirror 21X and X-axis reticle reference mirror. Note that the X positions detected by the reticle interferometers 14X1 and 14X2 will be respectively referred to as "XR1" and "XR2" hereinafter.

The reticle interferometers 14Y1 and 14Y2 have the same arrangement as that of the laser interferometers 13Y1 and 13Y2 described above except that they are placed to be opposite with the reflecting mirrors 21Y1 and 21Y2 and Y-axis reticle reference mirror. Note that the Y positions detected by the reticle interferometers 14Y1 and 14Y2 will be respectively referred to as "YR1" and "YR2" hereinafter.

The laser beams LRY1 and LRY2 reflected by the reflecting mirrors (cube corner prisms) 21Y1 and 21Y2 in the Y direction are respectively reflected by reflecting mirrors 14M1 and 14M2 to return. In this arrangement, even if the reticle fine adjustment stage 11 rotates, the laser beams are free from positional deviations. A rectangular illumination area 36 on the reticle R is irradiated with the exposure light EL, and observation areas for the reticle alignment systems 19 and 20 are set on two ends of the illumination area 36. Note that the illumination area 36 is conjugate to the exposure area 34 on the wafer W in FIG. 2. As shown in FIG. 11, for example, cruciform alignment marks 32A to 32F are formed on two sides of the pattern area of the reticle R. The positional relationship between the respective projection images formed by projecting the reference marks 30A to 30F formed on the reference mark plate 6 in FIG. 2 onto the reticle side is almost equal to the positional relationship between the alignment marks 32A to 32F.

The X-Y position (XR, YR) of the reticle fine adjustment stage 11, i.e., the X-Y position of the reticle R, is detected by the laser interferometers 14X1, 14X2, 14Y1, and 14Y2. More specifically, an X position XR of the fine adjustment stage 11 is detected on the basis of the X position measurement results XR1 and XR2 obtained by the laser interferometers 14X1 and 14X2 according to $$XR=(XR1+XR2)/2 \tag{7}$$

In addition, a Y position YR of the fine adjustment stage 11 is detected on the basis of the Y position measurement results YR1 and YR2 obtained by the reticle interferometers 14Y1 and 14Y2 according to $$YR=(YR1+YR2)/2 \tag{8}$$

A yawing amount $\theta_{ZR}$ Of the reticle R is detected on the basis of the measurement values XR1 and XR2 according to $$\theta_{ZR}=(XR1-XR2)/L3 \tag{9}$$

In addition, an orthogonality error variation $\Delta\omega_R$ between the reflecting mirror 21X and reflecting mirrors 21Y1 and 21Y2 is detected on the basis of the measurement values XR1, XR2, YR1, and YR2 according to $$\Delta\omega_R=(YR1-YR2)/L4-(XR1-XR2)/L3 \tag{10}$$

The coordinate system constituted by X-coordinate XR and Y-coordinate YR detected in the above manner will be referred to as a reticle stage coordinate system (XR, YR). This coordinate system (XR, YR) may differs from an ideal design orthogonal coordinate system constituted by X- and Y-axes to a certain degree. However, the reticle R is driven on the basis of the reticle stage coordinate system (XR, YR).

Measurement of the shapes of the reflecting surfaces of the reflecting mirrors 7X and 7Y, provided on the side surfaces of the substrate table 4, which are used to correct the X-Y position (XW, YW) of the substrate table 4 and the Abbe error in the X-Y position of the wafer W will be described next with reference to FIGS. 12 to 16. In this shape measurement, out of the constituent elements of the exposure apparatus 100 described above, the main control system 22, laser interferometers 13X1, 13X2, 13Y1, and 13Y2, wafer driving unit 24, alignment sensor 26, optical path changing plate 40, and the like are used. That is, a unit for measuring the shapes of the reflecting surfaces of the reflecting mirrors 7X and 7Y is comprised of the main control system 22, laser interferometers 13X1, 13X2, 13Y1, and 13Y2, wafer driving unit 24, alignment sensor 26, optical path changing plate 40, and the like.

First of all, the main control system 22 controls the substrate table 4 via the wafer driving unit 24 to drive the substrate table 4 to make the surface of the substrate table 4 become almost parallel to the X-Y plane. The main control system 22 then drives the optical path changing plate 40 via a plate driving unit (not shown) to retract the plate from the optical paths of the measurement light beams LWX1 and LWX2 that are sent out from the laser interferometers 13X1 and 13X2 and reach the reflecting mirror 7X, as represented by the laser interferometer 13X1 in FIG. 12. As a consequence, the measurement light beams LWX1 and LWX2 are incident onto the Z position ZW1 on the reflecting mirror 7X. Subsequently, the main control system 22 controls the wafer Y-axis driving stage 2 and wafer X-axis driving stage 3 via the wafer driving unit 24 to move the substrate table 4 to the measurement start position indicated by the solid line in FIG. 13. When the substrate table 4 reaches a predetermined position during the above movement of the substrate table 4, the laser interferometers 13X1, 13X2, 13Y1, and 13Y2 are reset. In this embodiment, when the substrate table 4 is moved to the measurement start position, the laser interferometers 13X1, 13X2, 13Y1, and 13Y2 are reset. A predetermined positional relationship is established between the reset positions of the laser interferometers 13X1, 13X2, 13Y1, and 13Y2 in a shape measurement process and the reset positions of the laser interferometers 13X1, 13X2, 13Y1, and 13Y2 in a position control process (to be described later).

The main control system 22 then controls the wafer Y-axis driving stage 2 via the wafer driving unit 24 to sequentially execute the process of almost simultaneously acquiring X positions XW1(t, ZW1) and XW2(t, ZW1) and Y positions YW1(t, ZW1) and YW2(t, ZW1) (t: time) detected by the laser interferometers 13X1, 13X2, 13Y1, and 13Y2 while moving the substrate table 4 in the −Y direction.

A local rotation amount $\theta_{ZX}(t, ZW1)$ of the reflecting surface 7XS around the Z-axis and a local rotation amount $\theta_{ZY}(t, ZW1)$ of the reflecting surface 7YS around the Z-axis in each acquisition process are given by $$\theta_{ZX}(t, ZW1) = (XW1(t, ZW1) - XW2(t, ZW1))/L11 \quad (11)$$

$$\theta_{ZY}(t, ZW1) = (YW1(t, ZW1) - YW2(t, ZW1))/L21 \quad (12)$$

In this case, since the substrate table 4 moves in the −Y direction, the measurement light beams LWY1 and LWY2 sent out the wafer interference systems 13Y1 and 13Y2 are substantially kept incident onto the same position on the reflecting mirror 7Y. Therefore, the local rotation amount $\theta_{ZY}(t, ZW1)$ of the reflecting mirror 7Y around the Z-axis includes no contribution from the one-dimensional change of the shape of the reflecting mirror 7Y in the Y-axis direction. Consequently, the rotation amount $\theta_{ZY}(t, ZW1)$ can be regarded as the rotation amount of the substrate table 4 around the Z-axis at time t upon movement of the substrate table 4, i.e., the yawing amount of the substrate table 4.

The local rotation amount $\theta_{ZX}(t, ZW1)$ of the reflecting mirror 7X around the Z-axis is the sum of the yawing amount of the substrate table 4 and the one-dimensional change of the shape in the X-axis direction of the reflecting surface 7XS of the reflecting mirror 7X in each acquisition process. Therefore, a local rotation amount $\Theta_{ZX}(t, ZW1)$ of the reflecting mirror 7X around the Z-axis due to the one-dimensional change of the shape in the X-axis direction of the reflecting surface 7XS of the reflecting mirror 7X is given by $$\Theta_{ZX}(t, ZW1) = \theta_{ZX}(t, ZW1) - \theta_{ZY}(t, ZW1) \quad (13)$$

A Y position YW(t, ZW1) of the substrate table 4 in each acquisition process is given by $$YW(t, ZW1) = (YW1(t, ZW1) + YW2(t, ZW1))/2 \quad (14)$$

This value is uniquely determined with respect to time t.

That is, the local rotation amount $\Theta_{ZX}(t, ZW1)$ of the reflecting mirror 7X around the Z-axis can be expressed as a local rotation amount $\Theta_{ZX}(YW, ZW1)$ of the reflecting mirror 7X around the Z-axis. Therefore, letting YWS be a Y position (to be referred to as a "measurement reference Y position" hereinafter) when the laser interferometers 13X1 and 13X2 are reset, a one-dimensional shape DXW(YW, ZW1) of the reflecting mirror 7X at the Z position ZW1 in the Y-axis direction is given by $$DXW(YW, ZW1) = \int_{YWS}^{YW} \Theta_{ZX}(t, ZW1) d(YW) \quad (15)$$

The main control system 22 calculates the one-dimensional shape DXW(YW, ZW1) of the reflecting mirror 7X at the Z position ZW1 in the Y-axis direction on the basis of the acquired X positions XW1(t, ZW1) and XW2(t, ZW1) and Y positions YW1(t, ZW1) and YW2(t, ZW1) by using equations (11) to (15).

Figure 13:
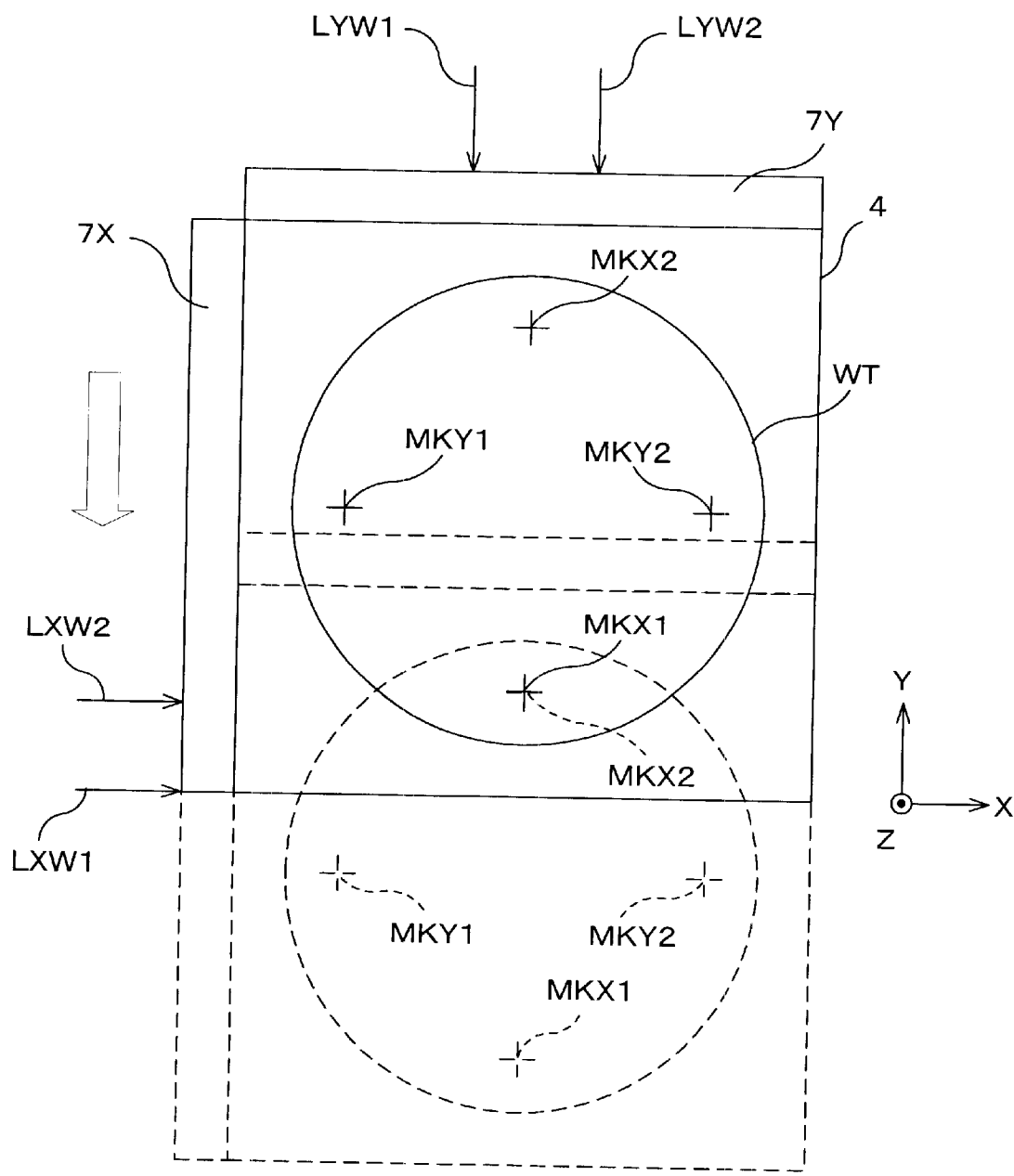
FIGS. 13 and 14 are views for explaining optical paths in laser interferometers in one-dimensional shape measurement.
Figure 14:
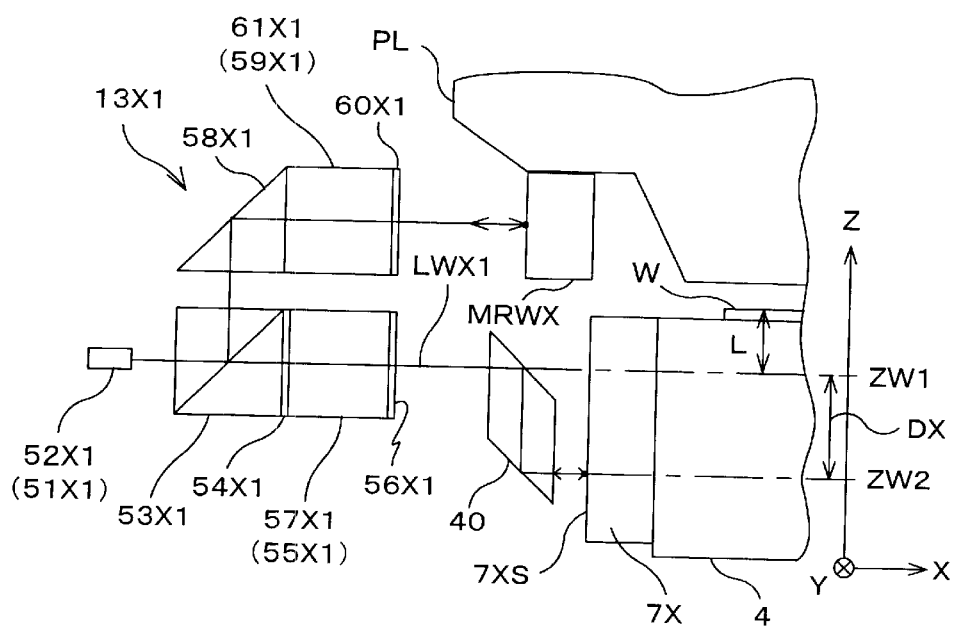

The main control system 22 controls the wafer Y-axis driving stage 2 and wafer X-axis driving stage 3 via the wafer driving unit 24 to move the substrate table to the measurement start position indicated by the solid line in FIG. 13. Subsequently, the main control system 22 drives the optical path changing plate 40 via the plate driving unit (not shown) to move it onto the optical paths of the measurement light beams LWX1 and LWX2 that are sent out from the laser interferometers 13x1 and 13X2 and reach the reflecting mirror 7X, as represented by the laser interferometer 13X1 in FIG. 14. As a consequence, the measurement light beams LWX1 and LWX2 are incident onto the Z position ZW2 on the reflecting mirror 7X. Thereafter, the laser interferometers 13X1 and 13X2 are reset.

As in one-dimensional shape measurement at the Z position ZW1, the main control system 22 controls the wafer X-axis driving stage 3 via the wafer driving unit 24 to sequentially execute the process of almost simultaneously acquiring Y positions XW1(t, ZW2) and XW2(t, ZW2) and Y positions YW1(t, ZW2) and YW2(t, ZW2) detected by the laser interferometers 13X1, 13X2, 13Y1, and 13Y2 while moving the substrate table 4 in the −Y direction. The main control system 22 then calculates a one-dimensional shape DYW(YW, ZW2) of the reflecting mirror 7X at the Z position ZW2 in the Y-axis on the basis of the acquired X positions XW1(t, ZW1) and XW2(t, ZW2) and Y positions YW1(t, ZW1) and YW2(t, ZW2) by using equations similar to equations (11) to (15).

In this manner, shape information [DXW(YW, ZW1), DXW(YW, ZW2)] of the reflecting surface 7XS of the reflecting mirror 7X is obtained.

As in the above measurement of the shape of the reflecting surface 7XS, the main control system 22, laser interferometers 13X1, 13X2, 13Y1, and 13Y2, wafer driving unit 24, alignment sensor 26, optical path changing plate 40, and the like are used to measure shape information [DYW(XW, ZW1), DYW(XW, ZW2)] of the reflecting surface 7YS of the reflecting mirror 7Y. That is, this information can be obtained by measuring the shape of the reflecting surface 7YS of the reflecting mirror 7Y using the main control system 22, laser interferometers 13X1, 13X2, 13Y1, and 13Y2, wafer driving unit 24, alignment sensor 26, optical path changing plate 40, and the like.

Figure 15:
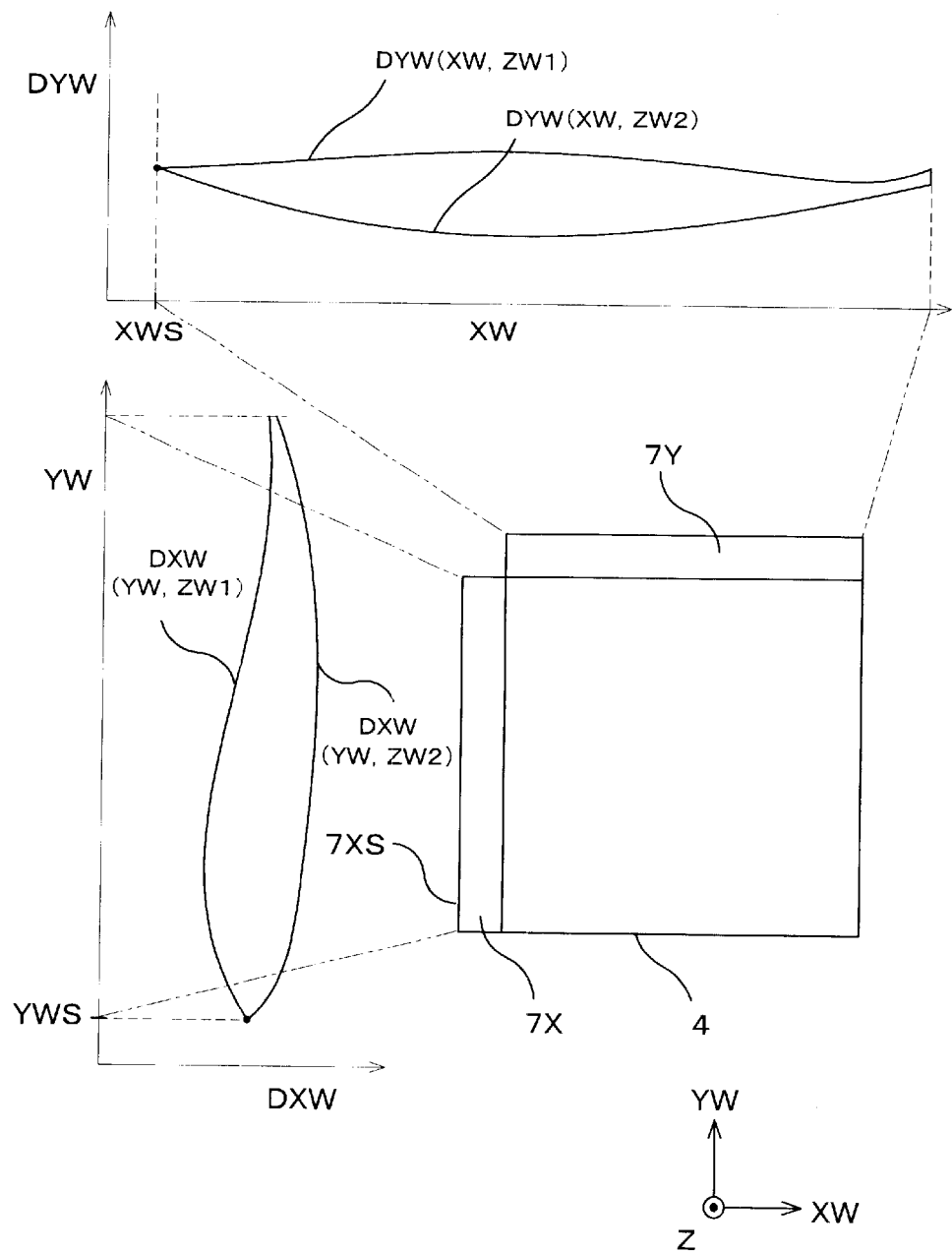
FIG. 15 is a view for explaining a measurement result on the shape of a reflecting surface before correction by reference mark position measurement.

FIG. 15 shows the shape information [DXW(YW, ZW1), DXW(YW, ZW2)] of the reflecting surface 7XS of the reflecting mirror 7X and the shape information [DYW(XW, ZW1), DYW(XW, ZW2)] of the reflecting surface 7YS of the reflecting mirror 7Y. A comparison between the one-dimensional shape DXW(YW, ZW1) and one-dimensional shape DXW(YW, ZW2) reveals that $$DXW(YWS, ZW1)=DXW(YWS, ZW2)$$

at the measurement reference Y position YWS. This is because both the laser interferometers 13X1 and 13X2 are reset at the measurement reference Y position YWS for the one-dimensional shape DXW(YW, ZW1) and one-dimensional shape DXW(YW, ZW2).

When, therefore, a rotation amount $\theta_Y(YW)$ of the reflecting surface 7XS around Y-axis at each Y position is calculated on the basis of the one-dimensional shape DXW(YW, ZW1) and one-dimensional shape DXW(YW, ZW2) according to $$\theta_Y(YW)=(DXW(YW, ZW1)-DXW(YW, ZW2))/DX \qquad (16),$$

then always $$\theta_Y(YWS)=0 \qquad (17).$$

According to equation (17), the rotation amount of the reflecting surface 7XS around the Y-axis is always measured as "0" at the measurement reference Y position YWS of the reflecting surface 7XS. In practice, however, the laser interferometers 13X1 and 13X2 are not always in the same state upon reset respectively in one-dimensional shape measurement at the Z position ZW1 and one-dimensional shape measurement at the Z position ZW2. In general, therefore, there is an offset between two-dimensional position detection values XW(ZW1) and YW(ZW1) at the Z position ZW1 and the two-dimensional position detection values XW(ZW2) and YW(ZW2) at the Z position ZW2. For this reason, the rotation amount $\theta_Y(YW)$ of the reflecting surface 7XS around the Y-axis at each Y position obtained by equation (16) differs from the actual rotation amount of the reflecting surface 7XS around the Y-axis. This applies to the rotation amount of the reflecting surface 7YS around the X-axis.

To compensate for such an offset, this embodiment uses a measurement wafer WT on which reference marks MKX1 and MKX2 and reference marks MKY1 and MKY2 arrayed in a direction perpendicular to the array direction of the reference marks MKX1 and MKX2 are formed, as shown in FIG. 13. The measurement wafer WT is mounted on the substrate table 4, and the X positions of the reference marks MKX1 and MKX2 and the Y positions of the reference marks MKY and MKY2 are measured in measurement on the one-dimensional shape DXW(YW, ZW1) and one-dimensional shape DXW(YW, ZW2) of the reflecting surface 7XS as follows. Note that the X positions of the reference marks MKX1 and MKX2 and the Y positions of the reference marks MKY1 and MKY2 are measured in the same manner in measurement on a one-dimensional shape DYW(XW, ZW1) and one-dimensional shape DYW(XW, ZW2) of the reflecting surface 7YS.

Prior to the above one-dimensional shape measurement, the measurement wafer WT on which the reference marks MKX1 and MKX2 and the reference marks MKY1 and MKY2 arrayed in the direction perpendicular to the array direction of the reference marks MKX1 and MKX2 are formed is loaded and held on the substrate table 4 so that the straight line connecting the reference marks MKX1 and MKX2 becomes almost parallel to the Y-axis, and the straight line connecting the reference marks MKY1 and MKY2 becomes almost parallel to the X-axis. Subsequently, the main control system 22 controls the wafer Y-axis driving stage 2 and wafer X-axis driving stage 3 via the wafer driving unit 24 to move the substrate table to the measurement start position indicated by the solid line in FIG. 13. That is, the main control system 22 controls the wafer Y-axis driving stage 2 via the wafer driving unit 24 to move the substrate table 4 to an X position where the reference marks MKX1 and MKX2 can be captured within the field of view of the alignment sensor 26 when the substrate table 4 is moved in the Y-axis direction, and also controls the wafer X-axis driving stage 3 to move the substrate table 4 to the measurement start position.

Subsequently, the one-dimensional shape DXW(YW, ZW1) measurement described above is performed, and maintaining the state of the laser interferometers 13X1, 13X2, 13Y1, and 13Y2 in this measurement, the X positions of the reference marks MKX1 and MKX2 and the Y positions of the reference marks MKY1 and MKY2 are measured by using the laser interferometers 13X1, 13X2, 13Y1, and 13Y2 and alignment sensor 26. The X positions of the reference marks MKX1 and MKX2 and the Y positions of the reference marks MKY1 and MKY2 measured in this manner are respectively represented by XMX1(ZW1), XMX2(ZW1), YMY1(ZW1), and YMY2(ZW1).

Likewise, the one-dimensional shape DXW(YW, ZW2) measurement described above is performed, and maintaining the state of the laser interferometers 13X1, 13X2, 13Y1, and 13Y2 in this measurement, the X positions of the reference marks MKX1 and MKX2 and the Y positions of the reference marks MKY1 and MKY2 are measured by using the laser interferometers 13X1, 13X2, 13Y1, and 13Y2 and alignment sensor 26. The X positions of the reference marks MKX1 and MKX2 and the Y positions of the reference marks MKY1 and MKY2 measured in this manner are respectively represented by XMX1(ZW2), XMX2(ZW2), YMY1(ZW2), and YMY2(ZW2).

Note that it does not matter which measurement is performed first, the above one-dimensional shape measurement or reference mark position measurement.

As a consequence, an X position offset $\Delta$XM1 can be obtained from the measurement on the reference mark MKX1; an X position offset $\Delta$XM2, from the measurement on the reference mark MKX2; a Y position offset $\Delta$YM1, from the measurement on the reference mark MKY1; and a Y position offset $\Delta$YM2, from the measurement on the reference mark MKY2, according to $$\Delta XM1=XM1(ZW1)-XM1(ZW2)$$

$$\Delta XM2=XM2(ZW1)-XM2(ZW2)$$

$$\Delta YM1=YM1(ZW1)-YM1(ZW2)$$

$$\Delta YM2=YM2(ZW1)-YM2(ZW2)$$

In this case, the values $\Delta$XM1 and $\Delta$XM2 reflect the difference between the X position of the substrate table 4 at the time, when the laser interferometers 13X1 and 13X2 are reset in the early stage of measurement on the one-dimensional shape DXW(YW, ZW1), and the X position of the substrate table 4 at the time, when the laser interferometers 13X1 and 13X2 are reset in the early stage of measurement on the one-dimensional shape DXW(YW, ZW2), i.e., an X offset amount $\Delta$XOF between the one-dimensional shape DXW(YW, ZW1) and one-dimensional shape DXW(YW, ZW2). The values $\Delta$YM1 and $\Delta$YM2 reflect the difference between the Y position of the substrate table 4 at the time, when the laser interferometers 13Y1 and 13Y2 are reset in the early stage of measurement on the one-dimensional shape DXW(YW, ZW1), and the Y position of the substrate table 4 at the time, when the laser interferometers 13Y1 and 13Y2 are reset in the early stage of measurement on the one-dimensional shape DXW(YW, ZW2), i.e., an Y offset amount ΔYOF between the one-dimensional shape DXW(YW, ZW1) and one-dimensional shape DXW (YW, ZW2).

The X offset amount ΔXOF is constant regardless of the YW value, and the values ΔXM1 and ΔXM2 are ideally equal to each other. However, the measurement values ΔXM1 and ΔXM2 include measurement errors, etc. In this embodiment, therefore, the X offset amount ΔXOF is calculated by $$\Delta XOF=(\Delta XM1+\Delta XM2)/2$$

The Y offset amount ΔYOF is constant regardless of the XW value, and the values ΔYM1 and ΔYM2 are ideally equal to each other. However, the measurement values ΔYM1 and ΔYM2 include measurement errors and the like. In this embodiment, therefore, the Y offset amount ΔYOF is calculated by $$\Delta YOF=(\Delta YM1+\Delta YM2)/2$$

The main control system 22 obtains shape information [dXW(YW, ZW1), dXW(YW, ZW2)] of the reflecting surface 7XS on the basis of the one-dimensional shape DXW (YW, ZW1), one-dimensional shape DXW(YW, ZW2), X offset amount ΔXOF, and Y offset amount ΔYOF. Note that the shape information [dXW(YW, ZW1), dXW(YW, ZW2)] of the reflecting surface 7XS is given by $$dXW(YW, ZW1)=DXW(YW, ZW1)$$

$$dXW(YW, ZW2)=DXW(YW+\Delta YOF, ZW2)+\Delta XOF$$

Shape information [dYW(XW, ZW1), dYW(XW, ZW2)] of the reflecting surface 7YS of the reflecting mirror 7Y is measured by using the main control system 22, laser interferometers 13X1, 13X2, 13Y1, and 13Y2, wafer driving unit 24, alignment sensor 26, optical path changing plate 40, and the like as in the above measurement on the shape of the reflecting surface 7XS of the reflecting mirror 7X. That is, this information is obtained by measuring the X positions of the reference marks MKX1 and MKX2 and the Y positions of the reference marks MKY1 and MKY2, in addition to the one-dimensional shape DYW(XW, ZW1) and one-dimensional shape DYW(XW, ZW2), by using the main control system 22, laser interferometers 13X1, 13X2, 13Y1, and 13Y2, wafer driving unit 24, alignment sensor 26, optical path changing plate 40, and the like.

Figure 16:
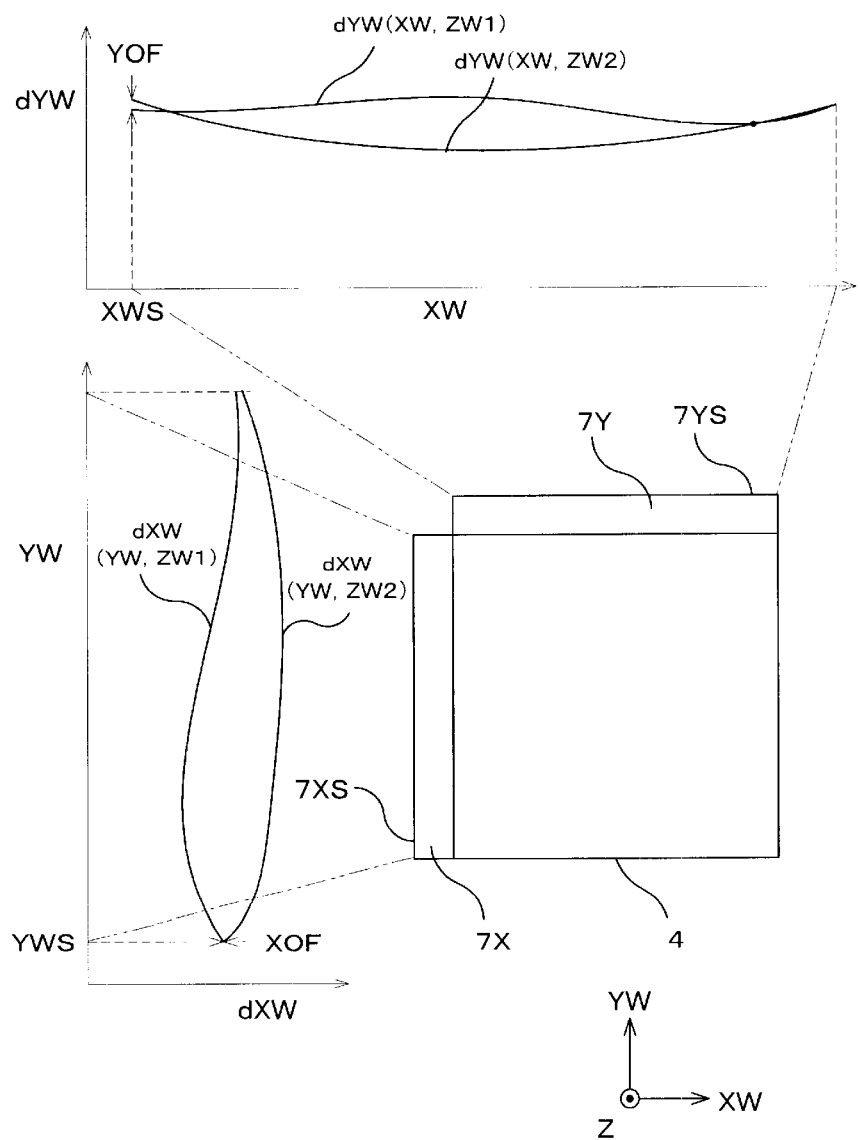
FIG. 16 is a view for explaining a measurement result on the shape of the reflecting surface after correction by reference mark position measurement.

FIG. 16 shows the shape information [dXW(YW, ZW1), dXW(YW, ZW2)] of the reflecting surface 7XS of the reflecting mirror 7X and the shape information [dYW(XW, ZW1), dYW(XW, ZW2)] of the reflecting surface 7YS of the reflecting mirror 7Y obtained in the above manner. These shape information [dXW(YW, ZW1), dXW(YW, ZW2)] and shape information [dYW(XW, ZW1), dYW(XW, ZW2)] are stored as the shape information data 27a in the storage unit 27 by the main control system 22.

In detecting the above X position XW, Y position YW, yawing amount $\theta_{ZW}$, and orthogonality error variations $\Delta\omega_W$ of the reflecting mirrors 7X and 7Y, the main control system 22 corrects measurement results XW1, XW2, YW1, YW2, which are obtained from the laser interferometers 13X1, 13X2, 13Y1, and 13Y2, considering the shape information [dWX(YW,ZW1)] of the reflecting surface 7XS and the shape information [dWY(XW,ZW1)] of the reflecting surface 7YS which are measured in advance in the above manner.

The main control system 22 also obtains Abbe errors on the basis of the tilt information ΔLWXP of the reflecting surface 7XS, detected by the laser interferometer 13XP, and the tilt information ΔLWYP of the reflecting surface 7YS, detected by the laser interferometer 13YP, in the following manner.

The value ΔLWXP detected by the laser interferometer 13XP includes an optical path difference ΔLWXP1 based on the rotation amount of the substrate table 4 around the Y-axis with reference to the reset state of the laser interferometer 13XP and an optical path difference ΔLWXP2 caused by the undulation, curls, and the like of the reflecting surface 7XS in the Y-axis direction. Note that the positional relationship between the reset positions of the laser interferometers 13X1, 13X2, 13Y1, and 13Y2 at the time of measurement on the shapes of the reflecting surfaces 7XS and 7YS described above and the reset positions of the laser interferometers 13X1, 13X2, 13Y1, and 13Y2 at the time of detection of the position of the substrate table 4 is predetermined and known in advance.

The Y position YWP of the irradiation point of the measurement light beam LWXP emerging from the laser interferometer 13XP is obtained by $$YWP=YW-(L11/2)-L12 \tag{18}$$

In addition, as described above, a Y position YWPO of the irradiation point of the measurement light beam LWXP at the time of reset operation of the laser interferometer 13XP is known. Therefore, the path difference ΔLWXP2 can be obtained by $$\Delta LWXP2=[\{dWX(YWP, ZW1)-dWX(YWP, ZW2)\}-\{dWX(YWPO, ZW1)-dWX(YWPO, ZW2)\}] \tag{19}$$

Consequently, the optical path difference ΔLWXP1 can be obtained by $$\Delta LWXP1=\Delta LWXP-\Delta LWXP2 \tag{20}$$

As a consequence, a rotation amount $\theta_{YW}$ of the substrate table 4 around the Y-axis is given by $$\theta_{YW}=\Delta LWXP1/DX \tag{21}$$

If a difference L (see FIG. 4) between the Z position ZW1 of the substrate table 4, obtained by X-Y position detection, and the Z position of the surface of the wafer W is known, an Abbe error $\Delta X_A$ in the X-axis direction due to the rotation amount $\theta_{YW}$ of the substrate table 4 around the Y-axis is given by $$\Delta X_A=L\cdot\theta_{YW} \tag{22}$$

Note that equations (17) to (22) given above are calculated by the main control system 22.

An Abbe error $\Delta Y_A$ in the Y-axis direction due to a rotation amount $\theta_{XW}$ of the substrate table 4 around the X-axis is obtained on the basis of the measurement result ΔLWYP obtained by the laser interferometer 13YP and the shape information [(dWY(XW, ZW1), dWY(XW, ZW2)] of the reflecting surface 7YS, as in the case of the Abbe error $\Delta X_A$ in the X-axis direction.

The Z position of the surface of the wafer W and its rotation amounts around the X- and Y-axes are detected by the multiple focal position detection system (28, 29) described above and supplied to the main control system 22.

The position and posture of the wafer W and Abbe errors are detected in the above manner.

The exposure operation of transferring a pattern formed on the reticle R onto the wafer W by the exposure apparatus 100 of this embodiment will be described next.

A reticle is loaded onto the reticle fine adjustment stage 11 of the reticle stage RST by a reticle loader (not shown). Reticle alignment is then performed by using the reference mark plate 6.

The operation of this reticle alignment will be briefly described below. First of all, under the control of the main control system 22, the wafer Y-axis driving stage 2 and wafer X-axis driving stage 3 are driven to move the reference marks 30A and 30B of the reference mark plate 6 into an exposure area (a pattern image projection area) conjugate to the illumination area 36 on the reticle R with respect to the projection optical system PL and stop them, and the reticle scanning stage 10 is driven to move the alignment marks 32A and 32B on a reticle R in FIG. 11 into the illumination area 36.

The reticle alignment systems 19 and 20 detect the positional offset amounts of the alignment marks 32A and 32B with respect to the reference marks 30A and 30B. The main control system 22 then drives the reticle scanning stage 10 and reticle fine adjustment stage 11 on the basis of the detected positional offset amounts to make the positional offset amounts of the alignment marks 32A and 32B respectively from the images of the reference marks 30A and 30B become symmetrical with each other, thereby matching the position and rotational angle of the reticle R with the reference mark plate 6. The offsets between the origins of the above reticle stage coordinate system (XR, YR) and wafer stage coordinate system (XW, YW) are corrected by, for example, resetting the four-axis measurement values obtained by the reticle interferometers 14X1, 14X2, 14Y1, and 14Y2 on the reticle stage RST side and the four-axis measurement values obtained by the laser interferometers 13X1, 13X2, 13Y1, and 13Y2 on the wafer stage side.

The scanning direction of the substrate table 4 in scanning exposure to be performed later is made to become parallel to the array direction of the reference marks 30A, 30C, and 30E of the reference mark plate 6. For this purpose, for example, the array direction of the reference marks 30A, 30C, and 30E is mechanically set to be parallel to the reflecting surface 7XS of the reflecting mirror 7X. If, however, a mechanical adjustment error remains, the scanning direction of the substrate table 4 may be corrected by software by changing the X-coordinate XW of the wafer stage, whenever the Y-coordinate YW of the wafer stage changes in a predetermined step, by the corresponding amount. The coordinate system whose Y-axis coincides with the scanning direction corrected in this manner will be referred to as a wafer state coordinate system (XW, YW) hereinafter.

The stage on the wafer stage side and the stage on the reticle stage side are moved in opposite directions as in scanning exposure without irradiating the exposure light EL, and the positional offset amounts of the alignment marks 32C to 32F on the reticle R relative respectively to the reference marks 30C to 30F on the reference mark plate 6 are sequentially detected by the reticle alignment systems 19 and 20. The tilt angle between the scanning direction of the reticle R and the scanning direction of the wafer W, i.e., the rotational angle between the in the scanning direction axes of the reticle stage coordinate system (XR, YR) and wafer stage coordinate system (XW, YW), is obtained from the average values of these relative positional offset amounts. In scanning the substrate table 4 afterward, while the Y-coordinate YR changes by a predetermined interval, the X-coordinate XR is laterally shifted by the corresponding amount via the reticle scanning stage 10 and reticle fine adjustment stage 11, thereby matching the scanning direction of the reticle R with the array direction of reference marks on the reference mark plate 6 by software. The coordinate system whose Y-axis coincides with the scanning direction corrected in this manner will be referred to as a reticle stage coordinate system (XR, YR) hereinafter.

As a consequence, the axes of the wafer stage coordinate system (XW, YW) and reticle coordinate system (XR, YR) in the scanning directions become parallel to each other with reference to the reference mark plate 6, and the reticle R and wafer W are scanned parallel in scanning exposure. In this case, since each stage is moved with reference to the guide surface of each stage, for example, the parallelism between the guide surface of the reticle scanning stage 10 and the guide surface of the wafer Y-axis driving stage 2 is mechanically adjusted to about several 100 $\mu$rad or less in advance.

In addition, the reflecting mirrors and reference mark plate 6 are fixed with reference to these guide surfaces to reduce the amount of correction made by software by also driving the respective stages in non-scanning directions in scanning exposure, thereby improving control precision. When the reticle R is actually placed on the reticle fine adjustment stage 11 adjusted in this manner, if the reticle R is placed with reference to the outer shape reference, etc., only the alignment marks 32A to 32F of the reticle R may be greatly rotated relative to the respective reflecting mirrors 21X, 21Y1, and 21Y2 and reference mark plate 6. This is because the positional offset amount between the outer shape of the reticle R and a transfer pattern is about 0.5 mm at maximum.

If the positional offset amount between the outer shape of the reticle R in FIG. 11 and the transfer pattern is large, when the positional offset amounts between the alignment marks 32A to 32F of the reticle R and the reference marks 30A to 30F of the reference mark plate 6 are measured, it is recognized that the reticle R and reference mark plate 6 are greatly rotated relative to each other or have a large offset. In this case, since the reference mark plate 6 is fixed with reference to the reflecting mirrors 7X and 7Y, correction is made by rotating or shifting the reticle fine adjustment stage 11.

If the reticle fine adjustment stage 11 is rotated, since the reflecting mirror 21X is also rotated, the reflecting mirror 21X tilts with respect to the running direction of the reticle R. However, the alignment marks 32A to 32F on the reticle R are parallel to the reference marks 30A to 30F on the reference mark plate 6, and the running directions of the substrate table 4 and wafer W are controlled to become parallel to each other in scanning exposure.

In the above reticle alignment, the distance (baseline amount) between the detection center of the alignment sensor 26 and a reference point in the exposure area 34 is obtained by a so-called baseline check using the reference mark plate 6 and stored in the storage unit 27.

The wafer W is then loaded onto the substrate table 4 by a wafer loader (not shown) and held by the substrate table 4. Wafer alignment is performed to obtain the arrangement of the respective shot areas on the wafer W on the wafer stage coordinate system (XW, YW). In this wafer alignment, as disclosed in Japanese Patent Laid-Open No. 61-44429 and U.S. Pat. No. 4,780,617 corresponding thereto, the alignment sensor 26 in FIG. 1 is used to detect the coordinate positions of wafer marks (not shown) in a predetermined number of shot areas (sample shots) selected from the wafer W, and the arrangement coordinates of all the shot areas on the wafer W are calculated by statistically processing the measurement result by the EGA (Enhanced Global Alignment) scheme. The above disclosures are incorporated herein by reference within the bounds of the domestic laws of the nations designated or selected by this internal application. Note that the coordinate positions of the wafer marks are detected on the basis of the measurement result (XW(=XF), YW) obtained by the above laser interferometers 13FX, 13Y1, and 13Y2, the measurement result ΔLFXP obtained by the laser interferometer 13FP, and the measurement result ΔLWYP obtained by the laser interferometer 13YP.

A shot area as an exposure target on the wafer W is positioned at the scanning start position and the reticle R is also positioned at the corresponding position on the basis of the array coordinates of the respective shot areas on the wafer W, the baseline amount of the alignment sensor 26, and the relationship between the wafer stage coordinate system (XW, YW) and reticle stage coordinate system (XR, YR).

Scanning exposure operation is then performed by synchronously moving the reticle R and wafer W in accordance with the wafer stage coordinate system (XW, YW) and reticle stage coordinate system (XR, YR) set in the preceding reticle alignment process while applying the exposure light EL. The coordinate system (XW, YW) and coordinate system (XR, YR) in this case have been corrected by software with reference to the reflecting surfaces of the reflecting mirrors 7X, 7Y, 21X, 21Y1, and 21Y2. The positional offset of the respective mirrors relative to the reticle R and wafer W will influence the shapes of shot areas and shot array. In this embodiment, scanning exposure and stepping operation are performed by the following method to form accurate rectangular shot areas and shot array in the form of an orthogonal matrix pattern even in this case.

Assume that when a shot area as an exposure target and a reticle are positioned by wafer alignment, the coordinates of the reticle stage coordinate system (XR, YR) and wafer stage coordinate system (XW, YW) are respectively represented by (XR0, XR0) and (XW0, YW0). In this case, since the projection optical system PL has the projection magnification β, synchronization errors ΔX and ΔY caused afterward in the scanning and non-scanning directions of the reticle fine adjustment stage 11 (reticle R) and substrate table 4 (wafer W) are given by $$\Delta X = (XW - XW0)/\beta - (XR - XR0) \quad (23)$$

$$\Delta Y = (YW - YW0)/\beta - (YR - YR0) \quad (24)$$

These synchronization errors, however, are errors calculated with respect to the reticle R. Although the projection optical system PL in FIG. 1 is an inversion projection system, since the measurement directions of the reticle interferometer 14 and wafer interferometer 13 are reverse to each other in the X-axis and Y-axis directions, a synchronization error can be obtained by simply calculating the difference between magnification correction values for the amounts of the movements.

In this embodiment, the difference between the yawing amount $\theta_{ZW}$ of the substrate table 4, given by equation (5), and the yawing amount $\theta_{ZR}$ of the reticle fine adjustment stage 11, given by equation (9), is represented as a synchronization error Δθ in the rotational direction as follows:

$$\Delta\theta = \theta_{ZW} - \theta_{ZR} = (XW1 - XW2)/L11 - (XR1 - XR2)/L3 \quad (25)$$

In scanning exposure, after the reticle scanning stage 10 and wafer Y-axis driving stage 2 in FIG. 1 start accelerating and reach predetermined scanning velocities, respectively, the reticle fine adjustment stage 11 is driven to perform synchronization control so as to reduce the above synchronization errors ΔX, ΔY, and Δθ to zero or predetermined allowable values or less. After a lapse of a predetermined settling time in this state, exposure is performed by starting irradiation of the illumination area 36 on the reticle R with the exposure light EL.

In scanning exposure, the Z position of the exposure area 34 on the wafer W, the rotational angle of the area around the X-axis, and the rotational angle of the area around the Y-axis are detected by the multiple focal position detection system (28, 29). The main control system 22 then drives the substrate table 4 via the wafer driving unit 24 on the basis of the detection results so as to match the exposure area 34 on the wafer W with the image surface of the projection optical system PL within the depth-of-focus range.

In wafer alignment, the tilt amount of the reflecting surfaces 7XS and 7YS are detected by the laser interferometers 13FP and 13YP. In scanning exposure, the tilt amounts of the reflecting surfaces 7XS and 7YS are detected by the laser interferometers 13XP and 13YP. The Abbe errors $\Delta X_A$ and $\Delta Y_A$ are obtained in the above manner on the basis of these detection results and shape information [dWX(YW, ZW1), dWX(YW, ZW2)] of the reflecting surface 7XS and shape information [dWY(XW, ZW1), dWY(XW, ZW2)] of the reflecting surface 7YS, and the X-Y position of the substrate table 4 (wafer W) is corrected by the Abbe errors $\Delta X_A$ and $\Delta Y_A$.

When the scanning exposure operation is complete, the main control system 22 performs stepping of the wafer W via the wafer driving unit 24 to perform exposure on the next shot area. In this stepping operation, if the orthogonality of the reflecting mirrors 7X and 7Y changes, the stepping direction is corrected by the orthogonality error variation $\Delta\omega_W$ given by equation (6).

In stepping operation, if the orthogonality error variation $\Delta\omega_W$ given by equation (6) or the orthogonality error variation $\Delta\omega_R$ given by equation (10) greatly changes beyond a predetermined allowable value, a problem may have been caused in terms of the precision of the baseline amount of the off-axis alignment sensor 26 or its mechanical stability. If, therefore, the orthogonality error variations $\Delta\omega_W$ and $\Delta\omega_R$ have greatly changed beyond predetermined allowable values, reticle alignment and baseline amount measurement are performed again when the wafer W is replaced. This makes it possible to improve the overlay accuracy between a pattern on the reticle R and each shot area on the wafer W.

In the above reticle alignment, wafer alignment, scanning exposure, and stepping operation, the X-Y position of the substrate table 4 is detected by the laser interferometers 13X1, 13X2, 13Y1, and 13Y2. The main control system 22 corrects the respective detection values in accordance with the shape information [dWX(YW,ZW1)] of the reflecting surface 7XS and the shape information [dWY(XW,ZW1)] of the reflecting surface 7YS. By handling the correction result as the X-Y position of the substrate table 4, the position control precision is further improved.

As described above, in the exposure apparatus 100 of this embodiment, the X-Y position of the substrate table 4 (wafer W) detected by the laser interferometers 13X1, 13X2, 13Y1, and 13Y2 is corrected by using the shape information of the reflecting surfaces 7XS and 7YS which are measured in advance and stored in the storage unit 27, and Abbe errors in the X-Y position of each exposure area on the wafer W due to the rotations of the substrate table 4 around the X- and Y-axes are compensated for in accordance with the tilt amounts of the reflecting surfaces 7XS and 7YS detected by the laser interferometers 13XP and 13YP. Even if, therefore, the reflecting surfaces 7XS and 7YS have undulation, curls, etc., the positions of the substrate table 4 and wafer W can be controlled very accurately. This makes it possible to perform high-precision exposure.

In addition, in the exposure apparatus 100 of this embodiment, the shapes of the reflecting surfaces 7XS and 7YS can be measured by the laser interferometers 13X1, 13X2, 13Y1, and 13Y2, wafer driving unit 24, alignment sensor 26, optical path changing plate 40, and the like under the control of the main control system 22. No other units for measuring the shapes of the reflecting surfaces 7XS and 7YS are required, and the shapes of the reflecting surfaces 7XS and 7YS can be measured at a required timing to update the shape information of the reflecting surfaces 7XS and 7YS stored in the storage unit 27.

In the exposure apparatus 100 of this embodiment, in one-dimensional shape measurement in shape measurement of the reflecting surfaces 7XS and 7YS, while the substrate table 4 is moved in a direction perpendicular to one reflecting surface different from the other reflecting surface as a shape measurement target, the rotation amount of the one reflecting surface around the Z-axis is detected to measure the yawing amount of the substrate table 4, and at almost the same time, the local rotation mount of the other reflecting surface around the Z-axis is measured. Therefore, the local rotation amount around the Z-axis which is based on only the shape of the other reflecting surface can be obtained by subtracting the yawing amount of the substrate table 4 at the time of measurement from the measured local rotation amount of the other reflecting surface round the Z-axis, thus accurately obtaining the one-dimensional shape of each reflecting surface. This makes it possible to accurately measure the shape of each reflecting surface.

The exposure apparatus 100 of this embodiment is made as follows. The illumination system having many mechanical components, optical components, and the like, the projection optical system PL having a plurality of lenses, the reticle stage RST and wafer stage unit, each having many mechanical components and the like, and the laser interferometers 13X1, 13X2, 13XP, 13Y1, 13Y2, 13YP, 13FX, 13FP, 14X1, 14X2, 14M1, and 14M2, which are described in the above embodiment, are mechanically and electrically coupled to each other. In addition, after the resultant structure is mechanically and electrically combined with the main control system 22, storage unit 27, and the like, overall adjustment (electrical adjustment, operation check, and the like) is performed.

Note that the exposure apparatus 100 is preferably made in a clean room in which temperature, cleanliness, and the like are controlled.

The manufacture of a device by the exposure apparatus and method of this embodiment will be described next.

Figure 17:
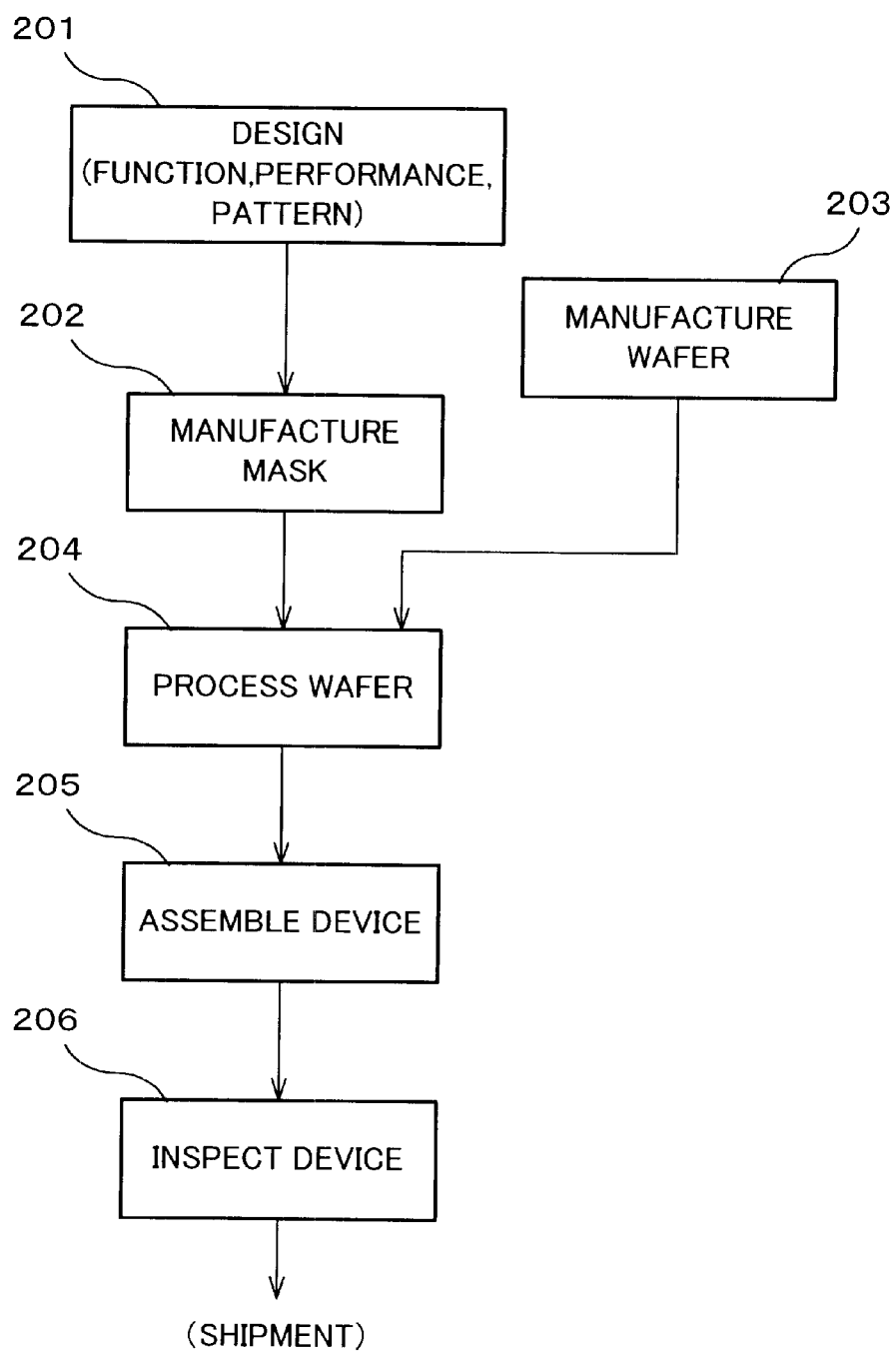
FIG. 17 is a flow chart explaining a device manufacturing method employing the exposure apparatus illustrated in FIG. 1.

FIG. 17 is a flow chart for the manufacture of a device (a semiconductor chip such as an IC or LSI, a liquid crystal panel, a CCD, a thin magnetic head, a micromachine, or the like) in this embodiment. As shown in FIG. 6, in step 201 (design step), function/performance design for a device (e.g., circuit design for a semiconductor device) is performed to perform pattern design to implement the function. In step 202 (mask manufacturing step), a mask on which the designed circuit pattern is formed is manufactured. In step 203 (wafer manufacturing step), a wafer is manufacturing by using a silicon material or the like.

In step 204 (wafer processing step), an actual circuit and the like are formed on the wafer by lithography or the like using the mask and wafer prepared in steps 201 to 203, as will be described later. In step 205 (device assembly step), a device is assembled by using the wafer processed in step 204. Step 205 includes processes such as dicing, bonding, and packaging (chip encapsulation).

Finally, in step 206 (inspection step), a test on the operation of the device, durability test, and the like are performed. After these steps, the device is completed and shipped out.

Figure 18:
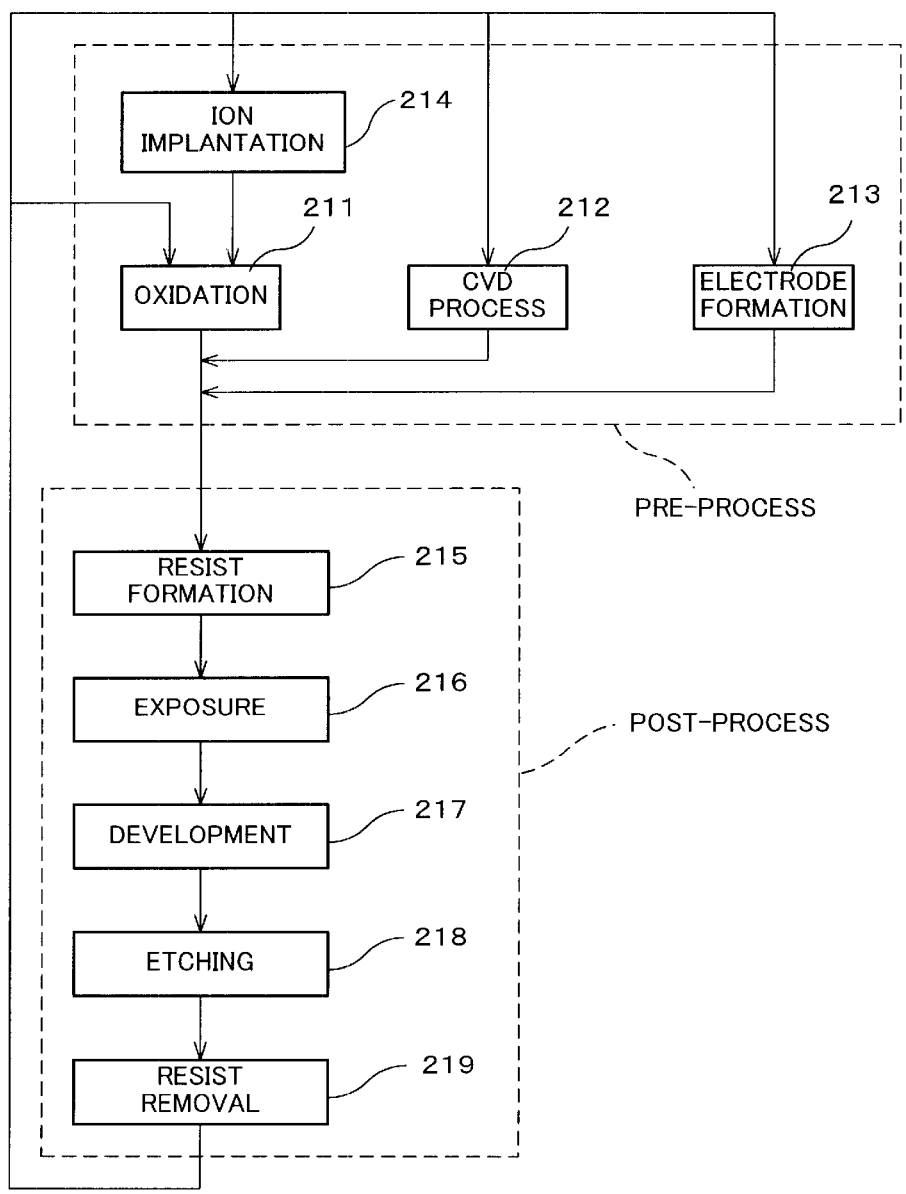
FIG. 18 is a flow chart showing the process of a wafer processing step (step 204) in FIG. 17.

FIG. 18 is a flow chart showing a detailed example of step 204 described above in manufacturing the semiconductor device. Referring to FIG. 17, in step 211 (oxidation step), the surface of the wafer is oxidized. In step 212 (CVD step), an insulating film is formed on the wafer surface. In step 213 (electrode formation step), an electrode is formed on the wafer by vapor deposition. In step 214 (ion implantation step), ions are implanted into the wafer. Steps 211 to 214 described above constitute a pre-process for the respective steps in the wafer process and are selectively executed in accordance with the processing required in the respective steps.

When the above pre-process is completed in the respective steps in the wafer process, a post-process is executed as follows. In this post-process, first of all, in step 215 (resist formation step), the wafer is coated with a photosensitive agent. In step 216, the circuit pattern on the mask is transferred onto the wafer by the above exposure apparatus and method. In step 217 (developing step), the exposed wafer is developed. In step 218 (etching step), an exposed member on a portion other than a portion where the resist is left is removed by etching. In step 219 (resist removing step), the unnecessary resist after the etching is removed.

By repeatedly performing these pre-process and post-process, multiple circuit patterns are formed on the wafer.

In the above manner, devices on which fine pattern are accurately formed are manufactured with high productivity.

In the above embodiment, in measuring the shapes of the reflecting surfaces 7XS and 7YS, each reflecting surface as a shape measurement target is irradiated with two light beams arrayed in the extending direction of the reflecting surface to perform shape measurement. However, by irradiating the reflecting surface as a shape measurement target with three light beams arrayed in the extending direction of the reflecting surface, the one-dimensional shape of the reflecting surface can also be measured by the surface shape measurement method disclosed in Japanese Patent Laid-Open No. 9-210648.

Figure 19:
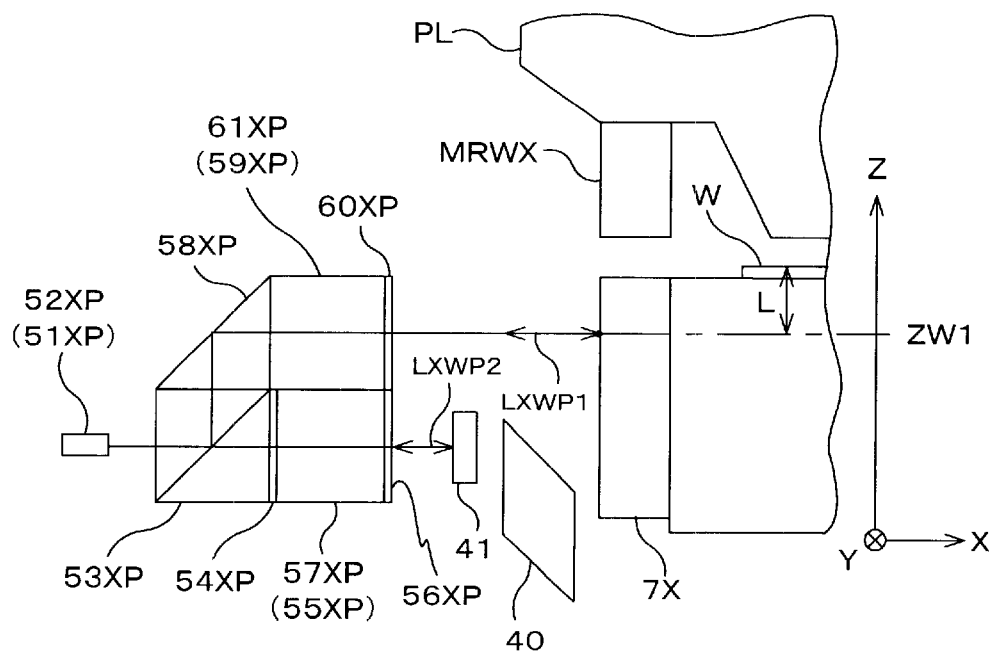
FIGS. 19 and 20 are views for explaining optical paths in laser interferometers in a modification of the one-dimensional shape measurement.
Figure 20:
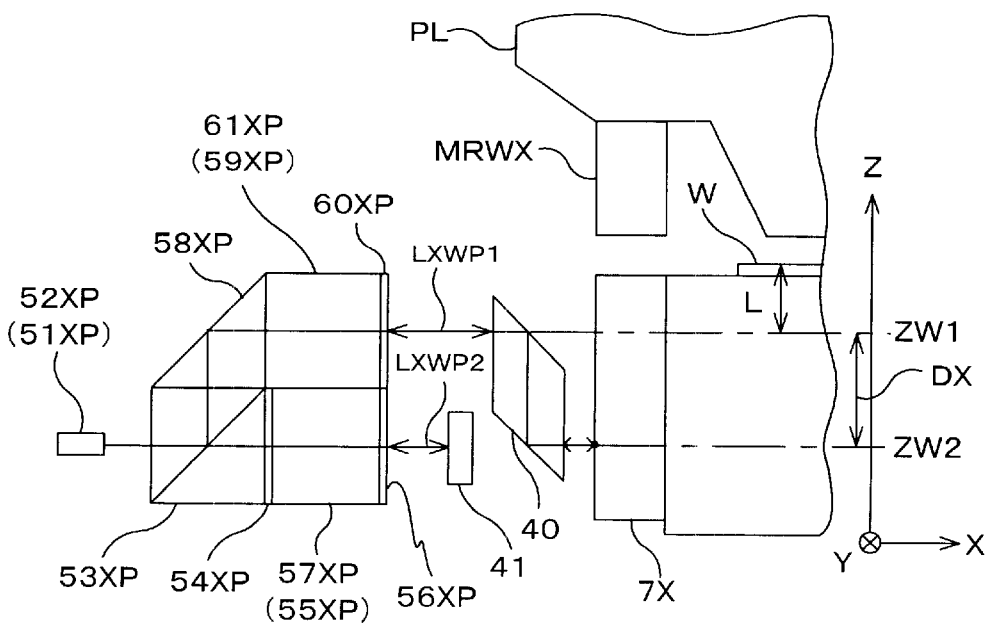

Such shape measurement will be described by taking the reflecting surface 7XS as an example. The reflecting surface is irradiated with the laser beam LWXP1, out of the two laser beams sent out from the laser interferometer 13XP for measuring the tilt amount of the reflecting surface, which is located at the same Z position ZW1 as that of the laser beams LWX1 and LWX2, in addition to the two laser beams LWX1 and LWX2 used for one-dimensional shape measurement in the above embodiment. Note that a reflecting mirror 41 is placed at a predetermined position on the optical path of the laser beam LWXP2, as shown in FIGS. 19 and 20. The three laser beams LWXP1, LWX1, and LWX2 incident on the reflecting surface are arrayed at different intervals (L11 and L12 in FIG. 2), respectively.

In performing one-dimensional shape measurement at the Z position ZW1, as in the above case of the laser beams LWX1 and LWX2, as shown in FIG. 19, every time the substrate table 4 is moved in the Y-axis direction by the difference between the above intervals while the optical path changing plate 40 is retracted from the optical path of the laser beam LWXP1, output values from the laser interferometers 13X1, 13X2, and 13XP are acquired to measure the local rotation amount of the reflecting surface 7XS around the Z-axis. In addition, the rotation amount of the substrate table 4 around the Z-axis is measured in the same manner as in the above embodiment. In performing one-dimensional shape measurement at the Z position ZW2, as in the above case of the laser beams LWX1 and LWX2, as shown in FIG. 20, measurement is performed in the same manner as at the Z position ZW1 while the optical path changing plate 40 is placed on the optical path of the laser beam LWXP1.

According to the above shape measurement using three light beams, the shape of the reflecting surface can be accurately measured.

Furthermore, one-dimensional shape measurement may be performed by using four or more light beams.

In the above embodiment, the optical path changing plate 40 is used for one-dimensional shape measurement at different Z positions on each reflecting surface. However, laser interferometers having the same arrangement as that of the laser interferometers 13X1 and 13X2 or laser interferometers 13Y1 and 13Y2 may be arranged at each measurement Z position. This arrangement increases the cost of the apparatus but allows quick, easy shape measurement on each reflecting surface. Therefore, this arrangement is especially effective in regularly detecting changes in undulation and curl of each reflecting surface.

In addition, a rotatable plane-parallel plate may be placed in an optical path in place of the optical path changing plate 40, and the Z-direction position of a laser beam may be continuously shifted by rotating the plane-parallel plate. In this case, one-dimensional shape measurement at a desired Z position can be performed with a simple arrangement.

A positional offset error of a pattern transfer position on a wafer can be detected by performing exposure on the wafer twice under a condition that a laser beam for two-dimensional position detection is incident onto the Z positions ZW1 on the reflecting surface and another condition that it is onto ZW2 by using a laser interferometer for two-dimensional position detection and an optical path changing plate. In addition, the difference between the shapes of the reflecting surface at different Z positions can be detected by discretely detecting marks on a reference wafer. By additionally performing the above one-dimensional shape measurement at one Z position, one piece of one-dimensional shape information and one piece of difference information can be obtained. They may be stored in the storage unit. Obviously, this method of storing one piece of one-dimensional shape information and one piece of difference information can be applied to the above embodiment.

In the above embodiment, to measure the shape of a reflecting surface, the one-dimensional shapes of the reflecting surface at two Z positions are measured. However, one-dimensional shapes at three or more Z positions may be measured. As the number of Z positions at which one-dimensional shape measurement is performed increases, the shape of the reflecting surface can be measured with higher accuracy.

In the above embodiment, the reflecting mirrors are attached to the side surfaces of the substrate table. However, the side surfaces of the substrate table may be mirror-polished to form reflecting surfaces.

In the above embodiment, laser beams from the tilt interferometers are incident on two points apart along the Z-axis on a reflecting surface. However, these points may differ in their X or Y positions as long as they differ in their Z positions.

Figure 21:
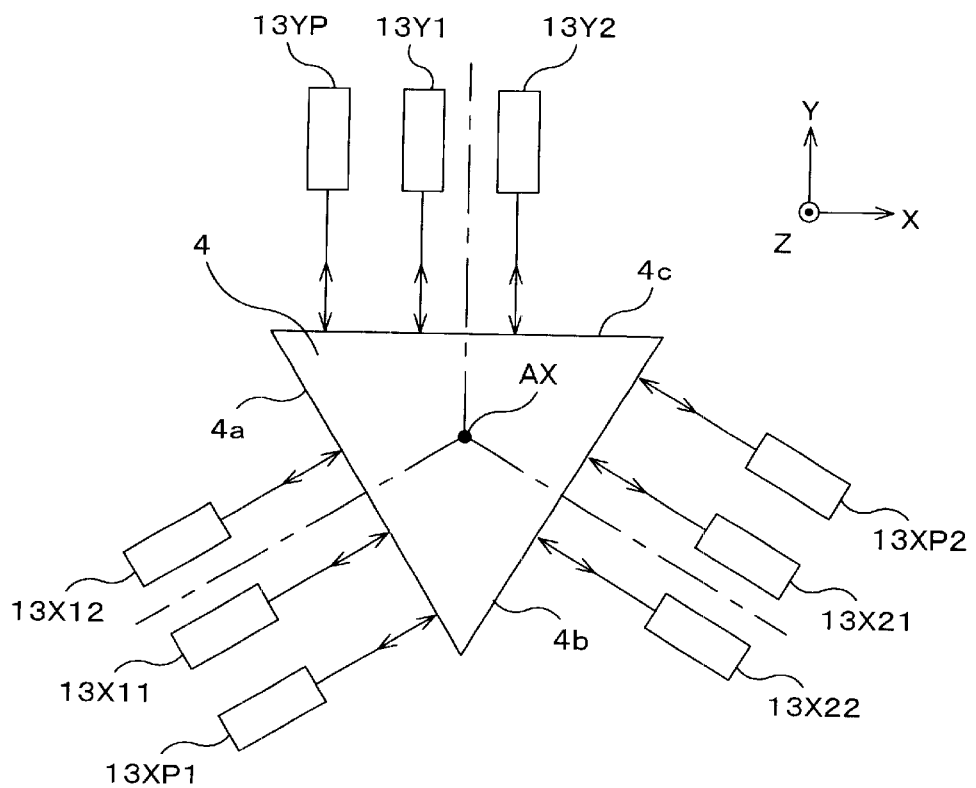
FIG. 21 is a view for explaining a modification of a stage having a triangular shape.

In the above embodiment, the wafer mount surface of the substrate table is rectangular. However, this surface may has another shape. If, for example, a triangular wafer mount surface is used, two-dimensional position detection laser interferometers 13X11, 13X12, 13X21, 13X22, 13Y1, and 13Y2 and tilt detection laser interferometers 13P1, 13P2, and 13YP may be arranged to face reflecting surfaces 4'$a$, 4'$b$, and 4'$c$ formed on the three side surfaces of a substrate table 4', as shown in FIG. 21. Note that the laser interferometers 13X11, 13X12, 13X21, and 13X22 may have the same arrangement as that of the laser interferometers 13X1 and 13X2 in the above embodiment, and the laser interferometers 13XP1 and 13XP2 may have the same arrangement as that of the laser interferometer 13XP in the above embodiment. In this case, in measuring, for example, the shape of the reflecting surface 4'$a$, the rotation amount of the substrate table 4' around the Z-axis is measured by the laser interferometers 13Y1 and 13Y2 while the substrate table 4' is moved in the Y-axis (third axis) direction, and at almost the same time, the local rotation amount of the reflecting surface 4'$a$ around the Z-axis is measured by the laser interferometers 13X11 and 13X12. With this operation, as in the above embodiment, the shape of the reflecting surface 4'$a$ is measured. In the case of the triangular substrate state 4' shown in FIG. 21, laser interferometers may be arranged for two crossing surfaces instead of all three side surfaces.

Figure 22:
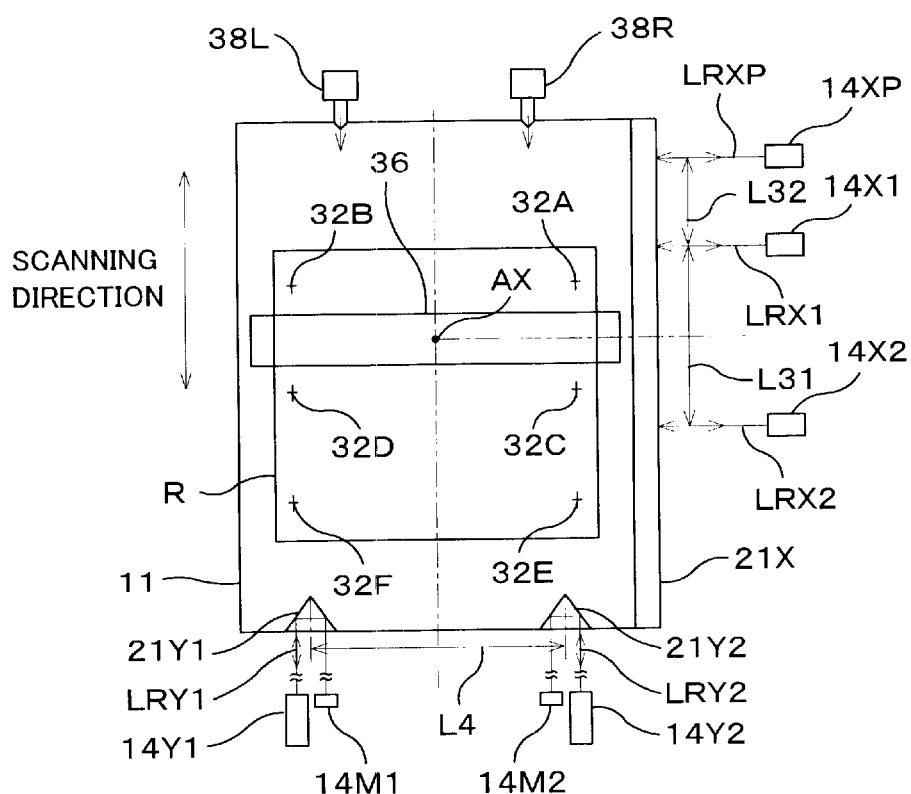
FIG. 22 is a view for explaining a modification of the shape measurement on a reflecting surface on a reticle stage.
Figure 23A:
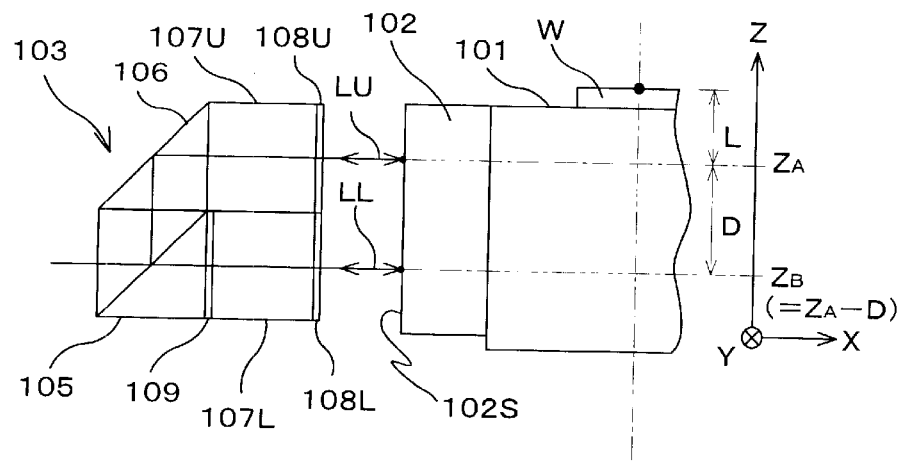
FIGS. 23A to 23C are views for explaining correction of Abbe errors in the prior art.
Figure 23B:
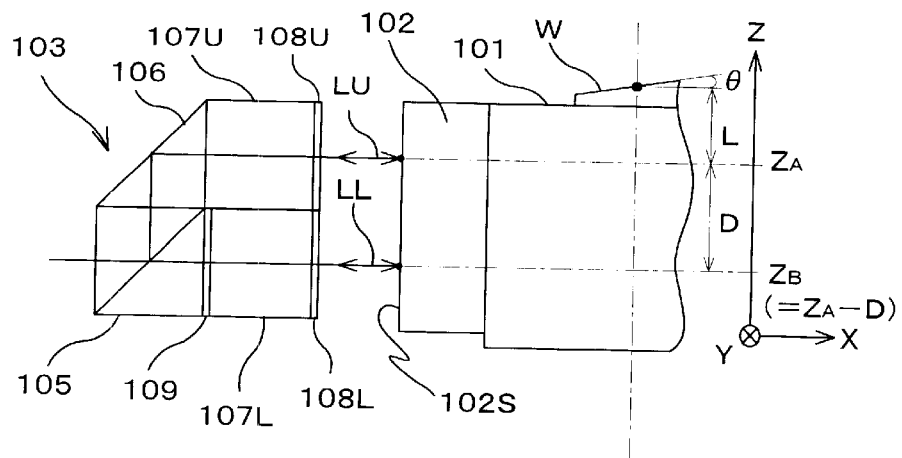
Figure 23C:
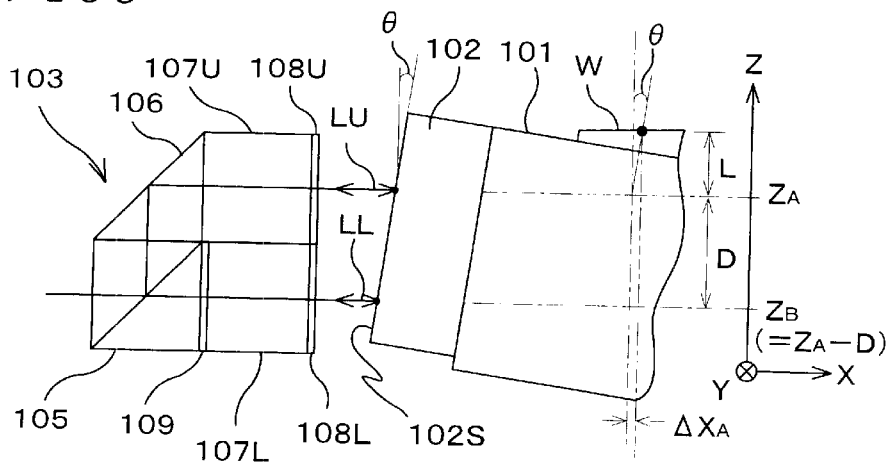
Figure 24A:
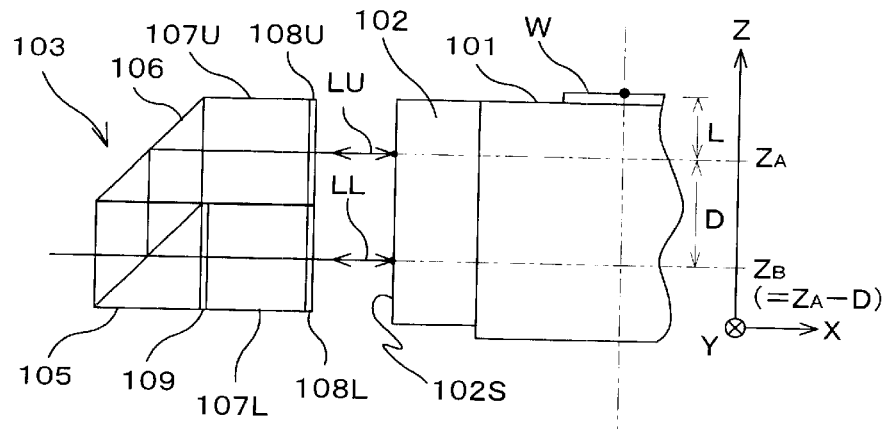
FIGS. 24A to 24C are views for explaining problems in correction of Abbe errors in the prior art.
Figure 24B:
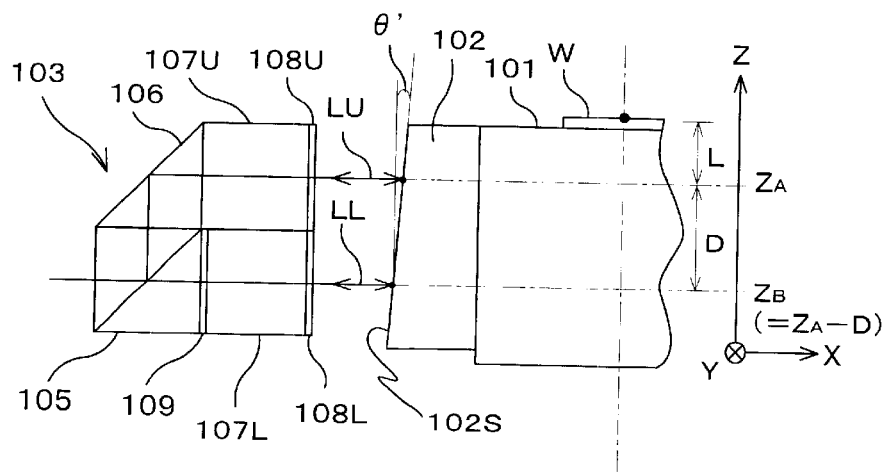
Figure 24C:
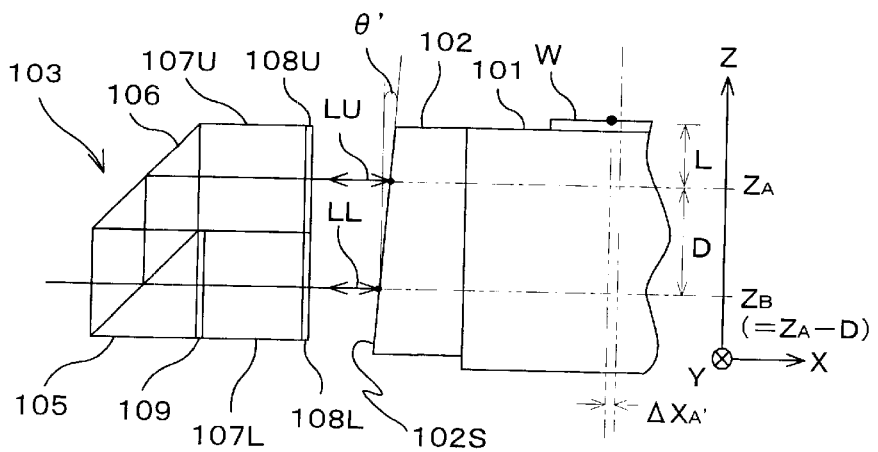

In the above embodiment, the shapes of the reflecting surfaces 7XS and 7YS provided on the substrate table 4 are measured, and the position of the substrate table 4 is controlled by using the resultant shape information. However, the position of the reticle fine adjustment stage 11 can be controlled by using shape information obtained by measuring the shape of the reflecting surface 21XS provided on the reticle fine adjustment stage 11. In this case, as shown in FIG. 22, a new tilt detection laser interferometer 14XP is placed in addition to the laser interferometers 14X1, 14X2, 14M1, and 14M2 in the above embodiment shown in FIG. 11. As in the case of the substrate table 4, the shape of the reflecting surface 21XS may be measured, and the position of the reticle fine adjustment stage 11 may be controlled by using the resultant shape information.

In the above embodiment, the detection results obtained by the tilt detection laser interferometers are exclusively used to compensate for Abbe errors. However, they can be used to correct the rotations of the stage around the X- and Y-axes.

The arrangements of the reticle stage and wafer stage are not limited to those in the above embodiment, and any arrangements can be taken. That is, the reticle stage may not have a coarse/fine adjustment structure, and the wafer stage may neither have a stage-stacked structure nor use a planar motor and the like as in the above embodiment.

In the above embodiment, each laser interferometer uses the Zeeman effect. However, interferometers having other arrangements may be used. In addition, a single-pass scheme may be used instead of a double-pass scheme.

If the offset between the two-dimensional position detection value at the Z position ZW1 and the two-dimensional position detection value at the Z position ZW2 is negligibly small, the alignment sensor in the above embodiment need not be used for measurement on the shape of a reflecting surface. That is, a two-dimensional position detection unit such as an alignment sensor is not essential to the shape measuring unit of the present invention.

In addition, the above embodiment has exemplified the step-and-scan type scanning exposure apparatus. However, the position control method of the present invention, by which in the position control of the stage (i.e., the sample mounted on the stage) the shapes of the reflecting surfaces provided on the stage are measured and position control is performed according to the resultant shape information, is adaptable to any wafer exposure apparatuses and liquid crystal exposure apparatuses such as a reduction projection exposure apparatus using ultraviolet light as a light source, a reduction projection exposure apparatus using soft X-rays having a wavelength of about 10 nm as a light source, an X-ray exposure apparatus using light having a wavelength of about 1 nm as a light source, and an exposure apparatus using an EB (Electron Beam) or ion beam. In addition, the present invention can be applied to any exposure apparatuses regardless of whether they are step-and-repeat exposure apparatuses, step-and-scan exposure apparatuses, or step-and-stitching exposure apparatuses.

Furthermore, the position control method of the present invention, by which in the position control of the stage the shapes of the reflecting surfaces provided on the stage are measured and position control is performed according to the resultant shape information, can be applied to not only the stage unit of an exposure apparatus but also general stage units. For example, by composing a stage unit using the components of the shape measuring unit and wafer stage unit of the above embodiment, position control of a sample table corresponding to the substrate table can be performed in the same manner as that of the substrate table in the above embodiment.

INDUSTRIAL APPLICABILITY

As has been described above, the shape measuring method and apparatus of the present invention are suitable to perform high-precision measurement on the shapes of reflecting surfaces provided on a moving object such as a stage so as to accurately control the position of a moving object such as a stage or a sample mounted on a moving object.

In addition, the position control method of the present invention is suited to high-precision position control on a moving object, including Abbe error compensation.

The stage unit of the present invention is suited to high-precision position control of a sample mounted.

The exposure apparatus of the present invention is suited to pattern transfer with improved exposure precision by high-precision position control of a mask and substrate.

What is claimed is:

1. A shape measuring method of measuring a shape of a reflecting surface which is formed on a moving object moving along a reference plane perpendicular to a first axis and extends along a second axis direction perpendicular to said first axis direction, wherein a one-dimensional shape of said reflecting surface in said second axis direction is measured at least at two positions in said first axis direction while said moving object is moved along a third axis direction which is perpendicular to said first axis direction and is not perpendicular to said second axis direction.

2. A shape measuring method according to claim 1, wherein in measuring said one-dimensional shape, a plurality of light beams forming a first set of measurement light beams are incident, along a plane parallel to said reference plane, onto different positions on said reflecting surface in said second axis direction while said moving object is moved in said third axis direction, a local rotation amount of said reflecting surface around said first axis in accordance with a moving position of said moving object based on said light beams reflected by said reflecting surface, and almost simultaneously, a second set of measurement light beams formed by a plurality of light beams which are apart from each other in a direction different from said first axis direction and propagate in said third axis direction are incident from said third axis direction onto a reflecting unit arranged on said moving object along a plane parallel to said reference plate, thereby measuring a rotation amount of said moving object around said first axis based on said light beams reflected by said reflecting unit.

3. A shape measuring method according to claim 2, wherein said second set of measurement light beams includes two light beams apart from each other along a direction perpendicular to said first axis direction and third axis direction.

4. A shape measuring method according to claim 2, wherein said first set of measurement light beams includes two light beams substantially perpendicular to said reflecting surface.

5. A shape measuring method according to claim 3, wherein
said first set of measurement light beams includes three light beams which are arranged at different intervals and perpendicular to said reflecting surface, and
a rotation amount of said moving object around said first axis and a local rotation amount of said reflecting surface around said first axis are measured every time said moving object is moved in said third axis direction by a distance corresponding to a difference between said different intervals.

6. A shape measuring method according to claim 1, wherein every time a one-dimensional shape of said reflecting surface is measured at least at two positions in said first axis direction, a two-dimensional position of a predetermined mark on said moving object within a plane parallel to said reference plane is measured, and said measured one-dimensional shape data is corrected based on a result of said measurement.

7. A position control method for a moving object which moves along a reference plane and has a reflecting surface, wherein at least one of a position and posture of said moving object is controlled based on shape information of said reflecting surface measured by said shape measuring method defined in claim 1, two-dimensional position information of said moving object measured by using said reflecting surface, and tilt information of said reflecting surface.

8. A shape measuring unit for measuring a shape of a reflecting surface which is formed on a moving object moving along a reference plane perpendicular to a first axis and extends along a second axis direction perpendicular to said first axis direction, comprising:
a first driving unit connected to said moving object to move moving said moving object along a third axis direction which is perpendicular to said first axis direction and is not perpendicular to said second axis direction; and
a measuring unit which measures a one-dimensional shape of said reflecting surface in said second axis direction at least at two positions in said first axis direction.

9. A shape measuring unit according to claim 8, wherein said measuring unit comprises
a first measuring unit which applies a plurality of light beams forming a first set of measurement light beams, along a plane parallel to said reference plane, at different positions on said reflecting surface in said second axis direction, and measures a local rotation amount of said reflecting surface around said first axis in accordance with a moving position of said moving object based on light reflected by said reflecting surface.

10. A shape measuring unit according to claim 9, wherein said first measuring unit comprises a first laser interferometer system in which an axis perpendicular to said first and second axes serves as a measurement axis.

11. A shape measuring unit according to claim 9, wherein said first set of measurement light beams includes two light beams substantially perpendicular to said reflecting surface.

12. A shape measuring unit according to claim 9, wherein said first set of measurement light beams includes three light beams which are arranged at different intervals and perpendicular to said reflecting surface.

13. A shape measuring unit according to claim 9, wherein said measuring unit further comprises a second driving unit connected to said moving object to move said moving object and said first measuring unit relative to each other in said first axis direction.

14. A shape measuring unit according to claim 9, wherein said measuring unit further comprises an optical path changing unit which changes irradiation points of said first set of measurement light beams on said reflecting surface along said first axis direction.

15. A shape measuring unit according to claim 9, wherein said measuring unit comprises a second measuring unit which makes a plurality of light beams forming a second set of measurement light beams, incident along a plane parallel to said reference plane, onto positions on said reflecting surface which differ from each other in said second axis direction and differ from said irradiation points of said first set of measurement light beams in said first axis direction, and measures a local rotation amount of said reflecting surface around said first axis in accordance with a moving position of said moving object based on said light beams reflected by said reflecting surface.

16. A shape measuring unit according to claim 15, wherein said second measuring unit comprises a second laser interferometer system in which an axis perpendicular to said first and second axes serves as a measurement axis.

17. A shape measuring unit according to claim 9, wherein said measuring unit further comprises:
- a third measuring unit which makes a third set of measurement light beams, formed by a plurality of light beams which are apart from each other in a direction different from said first axis direction and propagate in said third axis direction, incident from said third axis direction onto a reflecting unit arranged on said moving object along a plane parallel to said reference plate, and measures a rotation amount of said moving object around said first axis based on said light beams reflected by said reflecting unit.

18. A shape measuring unit according to claim 17, wherein said second measuring unit is a first laser interferometer system in which said third axis serves as a measurement axis.

19. A shape measuring apparatus according to claim 17, wherein said third set of measurement light beams includes two light beams apart from each other in a direction perpendicular to said first axis direction and third axis direction.

20. A shape measuring unit according to claim 18, wherein said reflecting unit comprises one of a reflecting mirror and a plurality of cube corner prisms.

21. A stage unit for moving a sample along a reference plane perpendicular to a first axis, comprising:
- a sample table on which said sample is mounted and which has a reflecting unit including at least one reflecting surface extending along a second axis direction perpendicular to said first axis direction;
- a driving unit connected to said sample table to drive said sample table along said reference plane; and
- a two-dimensional position detection system which irradiates said reflecting unit with two-dimensional position detection light beams and detects a two-dimensional position of said sample table based on said light beams reflected by said reflecting unit;
- a tilt detection system which irradiates said reflecting surface with at least two tilt detection light beams that are not in a plane and are parallel to said reference plane and detects a tilt amount of said reflecting surface with respect to said reference plane based on light beams reflected by said reflecting surface;
- said shape measuring unit defined in claim 8, which measures a shape of said reflecting surface;
- a storage unit connected to said shape measuring unit to store shape information of said reflecting surface measured by said shape measuring unit; and
- a control system connected to said driving unit, said two-dimensional position detection system, said tilt detection system, said shape measuring unit, and said storage unit to control at least one of a position and posture of said sample table by controlling said first driving unit based on two-dimensional position information detected by said two-dimensional position detection system, tilt information detected by said tilt detection system, and said shape information.

22. A stage unit according to claim 21, wherein said driving unit is used as a first driving unit in said shape measuring unit.

23. A stage unit according to claim 21, wherein said two-dimensional position detection light beams are two light beams that are vertically incident on said reflecting surface along a plane parallel to said reference plane, and said two light beams are used to measure a local rotation amount of said reflecting surface around said first axis in said shape measuring unit.

24. A stage unit according to claim 21, wherein said two-dimensional position detection light beams are two light beams which are vertically incident on said reflecting surface along a plane parallel to said reference plane, said two light beams and one of said tilt detection light beams are three light beams which are arranged at different intervals and vertically incident on said reflecting surface along a plane parallel to said reference plane, and said three light beams are used to measure a local rotation amount of said reflecting surface around said first axis.

25. An exposure apparatus for transferring a pattern formed on a mask mounted on a mask stage onto a substrate mounted on a substrate stage, comprising:
- said shape measuring unit defined in claim 8, which employs at least one of said mask stage and said substrate stage as a moving object;
- a two-dimensional position detection system which irradiates a reflecting unit mounted on said moving object and including said reflecting surface with two-dimensional position detection light beams, and detects a two-dimensional position of said moving object based on light beams reflected by said reflecting unit;
- a tilt detection system which irradiates said reflecting surface with at least two tilt detection light beams that are not in a plane and are parallel to said reference plane, and detects a tilt amount of said reflecting surface with respect to said reference plane based on said light beams reflected by said reflecting surface; and
- a control system connected to said shape measuring unit, said two-dimensional position detection system, and said tilt detection system to control at least one of a position and posture of said moving object based on shape information of said reflecting surface measured in advance by said shape measuring unit, two-dimensional position information detected by said two-dimensional position detection system, and tilt information detected by said tilt detection system.

26. An exposure apparatus for transferring a pattern formed on a mask onto a substrate, comprising:
- a substrate table which holds said substrate and has at least two reflecting surfaces extending in intersecting directions;
- a driving system connected to said substrate table to drive said substrate table;
- a two-dimensional position detection system which irradiates said at least two reflecting surfaces with measurement light beams and detects a two-dimensional position of said substrate table based on light beams reflected by said reflecting surfaces;
- a tilt detecting system which irradiates at least one of said at least two reflecting surfaces with at least two tilt detection light beams that are not in a plane and are parallel to said reference plane, and detects a tilt amount of said reflecting surface with respect to said reference plane based on light beams reflected by said reflecting surface;
- said shape measuring unit defined in claim 8, which measures a shape of a reflecting surface facing said tilt detection system;
- a storage unit connected to said shape measuring unit to store shape information of said reflecting surface facing said tilt detection system, which is measured by said shape measuring unit; and
- a control system connected to said driving system, said two-dimensional position detection system, said tilt detection system, said shape measuring unit, and said storage unit to control said shape measuring unit and also control at least one of a position and posture of said substrate table based on two-dimensional position information detected by said two-dimensional position detection system, tilt information detected by said tilt detection system, and said shape information.

27. An exposure apparatus according to claim 26, wherein said driving unit is used as a first driving unit in said shape measuring unit.

28. An exposure apparatus according to claim 26, wherein said measurement light beams applied on said reflecting surface facing said tilt detection system are two light beams which are vertically incident on said reflecting surface facing said tilt detection system along said reference plane, and said two light beams are used to measure a local rotation amount of said reflecting surface around a first axis in said shape measuring unit.

29. An exposure apparatus according to claim 26, wherein said measurement light beams applied on said reflecting surface facing said tilt detection system are two light beams which are vertically incident on said reflecting surface facing said tilt detection system along said reference plane, said two light beams and one of said tilt detection light beams are three light beams which are arranged at different intervals and vertically incident on said reflecting surface facing said tilt detection system along a plane parallel to said reference plane, and said three light beams are used to measure a local rotation amount of said reflecting surface around a first axis in said shape measuring unit.

30. An exposure apparatus according to claim 26, wherein
- said apparatus further comprises a mark detection system which detects a position of a mark formed on at least one of said substrate table and said substrate, and
- said control system corrects a one-dimensional shape measurement result of said reflecting surface based on a position detection result of said mark obtained by said mark detection system.

31. An exposure apparatus according to claim 26, wherein said at least two reflecting surfaces are two surfaces perpendicular to each other.

32. An exposure apparatus according to claim 26, wherein a substrate mount surface of said substrate table has a rectangular shape, and said at least two reflecting surfaces are respectively formed on at least two side surfaces of said substrate table.

33. An exposure apparatus according to claim 26, wherein
- said apparatus further comprises a leveling detection system which detects a position of a surface of said substrate in a direction perpendicular to said reference plane and a tilt of said surface with respect to said reference plane, and
- said control system controls a posture of said substrate table and a position of said substrate table in a direction perpendicular to said reference plane based on leveling information detected by said leveling detection system, and further controls a position of said substrate table within said reference plane based on two-dimensional position information detected by said two-dimensional position detection system, tilt information detected by said tilt detection system, and said shape information.

34. A method of making an exposure apparatus for transferring a pattern formed on a mask mounted on a mask stage onto a substrate mounted on a substrate stage, comprising the steps of:
- providing said shape measuring unit defined in claim 8, which employs at least one of said mask stage and said substrate stage as a moving object;
- providing a two-dimensional position detection system which irradiates a reflecting unit mounted on said moving object and including said reflecting surface with two-dimensional position detection light beams, and detects a two-dimensional position of said moving object based on light beams reflected by said reflecting unit;
- providing a tilt detection system which irradiates said reflecting surface with at least two tilt detection light beams that are not in a plane and are parallel to said reference plane, and detects a tilt amount of said reflecting surface with respect to said reference plane based on light beams reflected by said reflecting surface; and
- providing a control system connected to said shape measuring unit, said two-dimensional position detection system, and said tilt detection system to control at least one of a position and posture of said moving object based on shape information of said reflecting surface measured in advance by said shape measuring unit, two-dimensional position information detected by said two-dimensional position detection system, and tilt information detected by said tilt detection system.

35. A method of making an exposure apparatus for transferring a pattern formed on a mask onto a substrate, comprising the steps of:
- providing a substrate table which holds said substrate and has at least two reflecting surfaces extending in intersecting directions;
- providing a driving system connected to said substrate table to drive said substrate table;
- providing a two-dimensional position detection system which irradiates said at least two reflecting surfaces with measurement light beams and detects a two-dimensional position of said substrate table based on light beams reflected by said reflecting surfaces;

providing a tilt detecting system which irradiates at least one of said at least two reflecting surfaces with at least two tilt detection light beams that are not in a plane and are parallel to said reference plane, and detects a tilt amount of said reflecting surface with respect to said reference plane based on light beams reflected by said reflecting surface;

providing said shape measuring unit defined in claim 8, which measures a shape of a reflecting surface facing said tilt detection system;

providing a storage unit connected to said shape measuring unit to store shape information of said reflecting surface facing said tilt detection system, which is measured by said shape measuring unit; and providing a control system connected to said driving system, said two-dimensional position detection system, said tilt detection system, said shape measuring unit, and said storage unit to control said shape measuring unit and also control at least one of a position and posture of said substrate table based on two-dimensional position information detected by said two-dimensional position detection system, tilt information detected by said tilt detection system, and said shape information.

36. A method of making an exposure apparatus according to claim 35, further comprising the step of:

providing a mark detection system which detects a position of a mark formed on at least one of said substrate table and said substrate.

37. A method of making an exposure apparatus according to claim 35, further comprising the step of:

providing a leveling detection system which detects a position of a surface of said substrate in a direction perpendicular to said reference plane and a tilt of said surface with respect to said reference plane.

38. A device manufactured by using said exposure apparatus method defined in claim 25.

39. A device manufactured by using said exposure apparatus method defined in claim 26.

40. A method of manufacturing a device, which includes a lithography process, wherein said exposure apparatus defined in claim 25 is used in said lithography process.

41. A method of manufacturing a device, which includes a lithography process, wherein said exposure apparatus defined in claim 26 is used in said lithography process.

* * * * *